(12) United States Patent
Liang et al.

(10) Patent No.: US 8,900,664 B2
(45) Date of Patent: Dec. 2, 2014

(54) METHOD OF FABRICATING HIGH EFFICIENCY CIGS SOLAR CELLS

(71) Applicant: Intermolecular, Inc., San Jose, CA (US)

(72) Inventors: Haifan Liang, Fremont, CA (US); Jessica Eid, San Jose, CA (US); Jeroen Van Duren, Palo Alto, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/727,845

(22) Filed: Dec. 27, 2012

(65) Prior Publication Data

US 2014/0080250 A1    Mar. 20, 2014

Related U.S. Application Data

(60) Provisional application No. 61/701,290, filed on Sep. 14, 2012.

(51) Int. Cl.
| | | |
|---|---|---|
| *C23C 16/00* | (2006.01) | |
| *H01L 31/18* | (2006.01) | |
| *H01L 31/032* | (2006.01) | |
| *H01L 31/0392* | (2006.01) | |
| *H01L 31/065* | (2012.01) | |
| *H01L 31/0749* | (2012.01) | |
| *H01L 21/02* | (2006.01) | |

(52) U.S. Cl.
CPC ............ *H01L 31/18* (2013.01); *H01L 31/0322* (2013.01); *H01L 31/03923* (2013.01); *H01L 31/03928* (2013.01); *H01L 31/065* (2013.01); *H01L 31/0749* (2013.01); *H01L 21/02551* (2013.01); *Y02E 10/541* (2013.01)

USPC ................ 427/255.31; 438/95; 257/E31.027; 427/250; 427/255.7; 427/376.3; 427/376.4; 427/255.39

(58) Field of Classification Search
CPC ............ H01L 31/0322; H01L 31/1864; H01L 31/02725; H01L 21/02568; H01L 21/02208; H01L 21/0212
USPC ......... 438/57, 95, 69; 257/E31.027; 136/262, 136/263, 264, 265; 427/225.29, 255.31, 427/255.34

See application file for complete search history.

(56) References Cited

U.S. PATENT DOCUMENTS

2007/0166453 A1 * 7/2007 Van Duren et al. ........... 427/190
2012/0313200 A1 * 12/2012 Jackrel et al. ................. 257/431

OTHER PUBLICATIONS

Lingg et al.; Sodium fluoride thin films by chemical vapor deposition; Jul. 30, 1991; Elsevier Sequoia; Thin Solid Films; pp. 9-16.
Archer et al.; Clean Electricity from Photovoltaics, Book Excerpt; 2001; Imperial College Press, pp. 294-296.

* cited by examiner

*Primary Examiner* — Matthew Reames
*Assistant Examiner* — Vincent Wall

(57) ABSTRACT

A method is disclosed for fabricating high efficiency CIGS solar cells including the deposition of a multi-component metal precursor film on a substrate. The substrate is then inserted into a system suitable for exposing the precursor to a chalcogen to form a chalcogenide TFPV absorber. One or more Na precursors are used to deposit a Na-containing layer on the precursor film in the system. This method eliminates the use of dedicated equipment and processes for introducing Na to the TFPV absorber.

20 Claims, 20 Drawing Sheets

METHOD OF FABRICATING HIGH EFFICIENCY CIGS SOLAR CELLS

CROSS-REFERENCE TO RELATED APPLICATION

This application claims priority to U.S. Provisional Patent Application Ser. No. 61/701,290, filed on Sep. 14, 2012, which is herein incorporated by reference for all purposes.

FIELD OF THE DISCLOSURE

This disclosure relates to thin film photovoltaic devices, and more particularly, to an absorber layer for a thin film photovoltaic device that has a graded bandgap, and methods of forming the same. More specifically, methods of developing absorbers for copper indium gallium (sulfide) selenide (CIG(S)Se, or CIGS) solar cells are discussed.

BACKGROUND OF THE DISCLOSURE

Solar cells are photovoltaic (PV) devices that convert light into electrical energy. Solar cells have been developed as clean, renewable energy sources to meet growing demand. Solar cells have been implemented in a wide number of commercial markets including residential rooftops, commercial rooftops, utility-scale PV projects, building integrated PV (BIPV), building applied PV (BAPV), PV in electronic devices, PV in clothing, etc. Currently, crystalline silicon solar cells (both mono-crystalline and multi-crystalline) are the dominant technologies in the market. Crystalline silicon (cSi) solar cells must use a thick substrate (>100 um) of silicon to absorb the sunlight since it has an indirect bandgap and low absorption coefficient. The use of a thick substrate also means that the crystalline silicon solar cells must use high quality material to provide long carrier lifetimes. Therefore, crystalline silicon solar cell technologies lead to increased costs. Thin film photovoltaic (TFPV) solar devices based on amorphous silicon (a-Si), CIGS, cadmium telluride (CdTe), copper zinc tin sulfide (CZTS), etc. provide an opportunity to increase the material utilization since only thin films (<10 um) are generally required. The thin film solar cells may be formed from amorphous, nanocrystalline, micromorph, micro-crystalline, polycrystalline, or mono-crystalline materials. TFPV devices may include a single absorber layer for converting light into electricity, or multiple absorber layers with tuned absorption spectra for converting light into electricity in a tandem configuration. The tandem configuration might be a two-terminal device, or a multi-terminal (e.g. four-terminal) device structure. The multi-terminal device structure might be comprised of one stack of layers on one substrate, or involve different stacks of layers on multiple stacked substrates.

TFPV devices provide an opportunity to reduce energy payback time, and reduce water usage for solar panel manufacturing. Typical CdTe and CZTS films have bandgaps of about 1.5 eV and therefore, are an ideal match for the AM1.5G solar spectrum to allow for high efficiencies. The absorption coefficient for CdTe is about $10^5$/cm and the absorption coefficient for CZTS is about $10^4$/cm. CIGS films have bandgaps in the range of 1.0 eV (CIS) to 1.65 eV (CGS) and are also efficient absorbers across the entire solar spectrum. The absorption coefficient for CIGS is also about $10^5$/cm. Among the thin film solar technologies, CIGS has demonstrated the best lab cell efficiency (over 20%) and the best large area module efficiency (>15%).

A class of PV absorber films of special interest is formed as CIGS-type IB-IIIA-VIA multinary chalcogenide compounds from Groups IB, IIIA, and VIA of the periodic table. Group IB includes Cu, Ag, and Au. Group IIIA includes B, Al, Ga, In, and Tl. Group VIA includes O, S, Se, Te, and Po. Additionally, the IB-IIIA-VIA materials can be doped with dopants from Groups VIII, IIB, IVA, VA, and VIIA of the periodic table. Group VIII includes Fe, Ru, Os, Co, Rh, Ir, Ni, Pd, and Pt. Group IIB includes Zn, Cd, and Hg. Group IVA includes C, Si, Ge, Sn, and Pb. Group VA includes N, P, As, Sb, and Bi. Group VIIA includes F, Cl, Br, I, and At. Other potential absorber materials of interest include kesterites like CZTS, cuprous oxide, iron sulfide, tungsten sulfide, calcium nitride, zinc phosphide, barium silicide, etc.

TFPV devices can be fabricated at the cell level or the panel level, thus further decreasing the manufacturing costs. As used herein, the cell level is understood to mean an individual unit that can be combined with other units to form a module. The cells may be rigid or flexible. As used herein, the panel level is understood to mean a large TFPV structure that is not composed of smaller units. Generally, the panels are similar in size to the aforementioned modules. For economy of language, the phrase "TFPV device" will be understood to refer to either a solar cell or a panel without distinction. Furthermore, TFPV devices may be fabricated on inexpensive substrates such as glass, plastics, and thin sheets of metal. Examples of suitable substrates comprise float glass, low-iron glass, borosilicate glass, flexible glass, flexible ceramics, specialty glass for high temperature processing, stainless steel, carbon steel, aluminum, cladded foils, copper, polyimide, plastics, etc. Furthermore, the substrates may be processed in many configurations such as single substrate processing, multiple substrate batch processing, in-line continuous processing, roll-to-roll processing, etc.

The increasing demand for environmentally friendly, sustainable and renewable energy sources is driving the development of large area, thin film photovoltaic devices. With a long-term goal of providing a significant percentage of global energy demand, there is a concomitant need for Earth-abundant, high conversion efficiency materials for use in photovoltaic devices. A number of Earth abundant, direct-bandgap semiconductor materials now seem to show evidence of the potential for both high efficiency and low cost in Very Large Scale (VLS) production (e.g. greater than 100 gigawatt (GW)), yet their development and characterization remains difficult because of the complexity of the materials systems involved.

Among the TFPV technologies, CIGS and CdTe are the two that have reached volume production with greater than 11% stabilized module efficiencies. However, the supply of In, Ga and Te may impact annual production of CIGS and CdTe solar panels. Moreover, price increases and supply constraints in Ga and In could result from the aggregate demand for these materials used in flat panel displays (FPD) and light-emitting diodes (LED) along with CIGS TFPV. Also, there are concerns about the toxicity of Cd throughout the lifecycle of the CdTe TFPV solar modules. Efforts to develop devices that leverage manufacturing and R&D infrastructure related to these TFPV technologies but using more widely available and more environmentally friendly materials should be considered a top priority for research. The knowledge and infrastructure developed around CdTe and CIGS TFPV technologies can be leveraged to allow faster adoption of new TFPV materials systems.

The development of TFPV devices exploiting Earth abundant materials represents a daunting challenge in terms of the time-to-commercialization. That same development also suggests an enticing opportunity for breakthrough discoveries. A quaternary system such as CIGS requires management of multiple kinetic pathways, thermodynamic phase equilibrium considerations, defect chemistries, and interfacial control. The vast phase-space to be managed includes process parameters, source material choices, compositions, and overall integration schemes. The complexity of the intrinsically-doped, self-compensating, multinary, polycrystalline, queue-time-sensitive, thin-film absorber (CIGS), and its interfaces to up-, and down-stream processing, combined with the lack of knowledge on a device level to address efficiency losses effectively, makes it a highly empirical material system. The performance of any thin-film, (opto-)electronically-active device is extremely sensitive to its interfaces. Interface engineering for electronically-active devices is highly empirical. Traditional R&D methods are ill-equipped to address such complexity, and the traditionally slow pace of R&D could limit any new material from reaching industrial relevance when having to compete with the incrementally improving performance of already established TFPV fabrication lines, and continuously decreasing panel prices for more traditional cSi PV technologies.

Due to the complexity of the material, cell structure, and manufacturing process, both the fundamental scientific understanding and large scale manufacturability are yet to be realized for TFPV devices. As the photovoltaic industry pushes to achieve grid parity, much faster and broader investigation is needed to explore the material, device, and process windows for higher efficiency and a lower cost of manufacturing process. Efficient methods for forming different types of TFPV devices that can be evaluated are necessary.

In light of the above, there is a need in the art for an economical method of creating CIGS absorber layers having a graded bandgap. A graded bandgap allows for higher efficiency CIGS solar cells.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, methods are disclosed for fabricating high efficiency CIGS solar cells including the deposition of a multi-component metal precursor film on a substrate. The substrate is then inserted into a system suitable for exposing the precursor to a chalcogen to form a chalcogenide TFPV absorber. One or more Na precursors are used to deposit a Na-containing layer on the precursor film in the system. This method eliminates the use of dedicated equipment and processes for introducing Na to the TFPV absorber.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
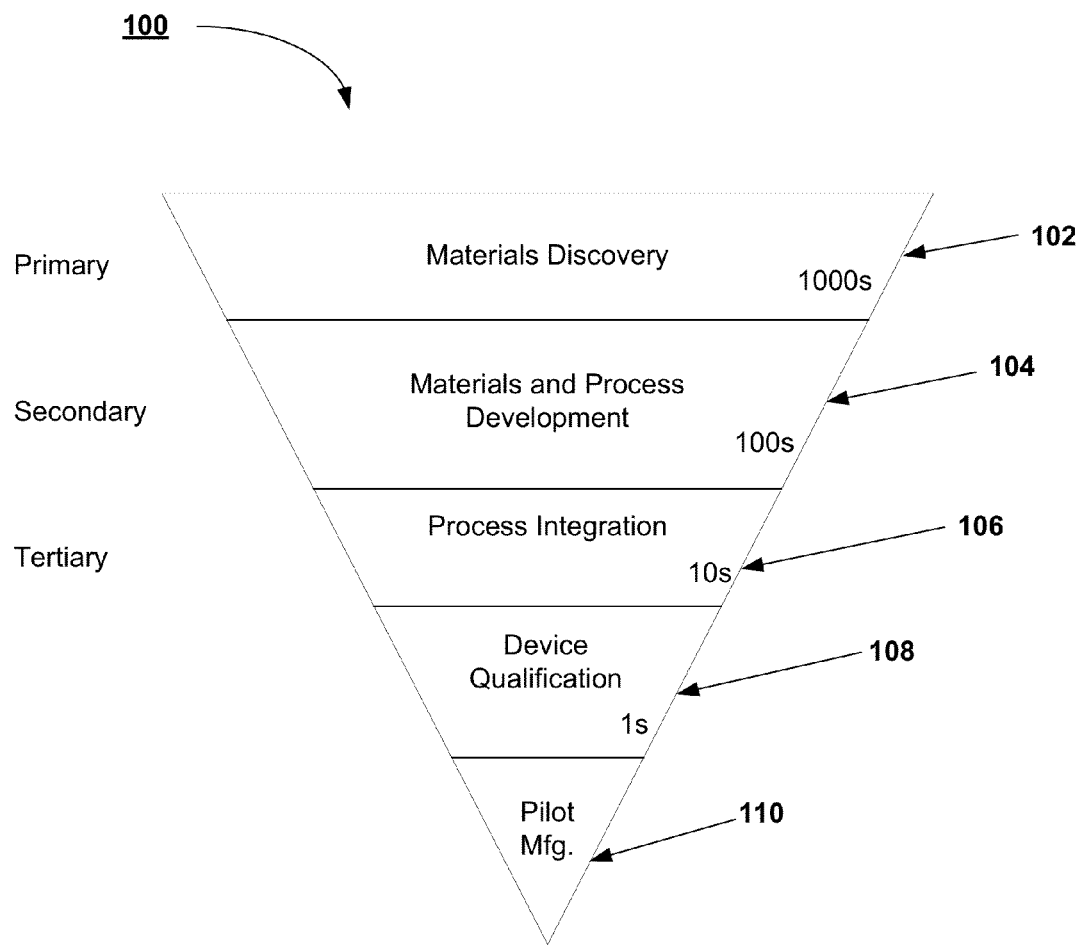
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

As used herein, "CIGS" will be understood to represent the entire range of related alloys denoted by $Cu_zIn_{(1-x)}Ga_xS_{(2+w)(1-y)}Se_{(2+w)y}$, where $0.5 \leq z \leq 1.5$, $0 \leq x \leq 1$, $0 \leq y \leq 1$, $-0.2 \leq w \leq 5$. Similarly, as noted above, other materials (i.e. Ag, Au, Te, etc.) may be incorporated into potential absorber layers, (with e.g. Ag replacing part or all of the Cu, and Te replacing part or all of the Se and/or S). Also as mentioned previously, any of these materials may be further doped with a suitable dopant. As used herein, "CIGSSe", "CIGSe", and "CIGS" will be defined as equivalent and will be used interchangeably and will include all compositions including Cu—In—Ga—Se—S, Cu—In—Ga—Se, and Cu—In—Ga—S. Furthermore, "CIGS" also includes other IB-IIIA-VIA alloys, like (Ag,Cu)(In,Ga)(Se), or (Cu)(In,Ga)(S,Se,Te), and the like.

As used herein, the notation "(IIIA)" will be understood to represent the sum of the concentrations of all Group-IIIA elements. This notation will be used herein in calculations of the composition ratios of various elements. This notation will be understood to extend to each of the other Groups of the periodic table respectively (e.g. "(IA)", "(IIA)", "(IVA)", "(VIA)", "(IB)", "(IIB)", etc.).

As used herein, the notation "Cu—In—Ga" and "Cu(In,Ga)" will be understood to include a material containing these elements in any ratio. The notation is extendable to other materials and other elemental combinations.

As used herein, the notation "$Cu_xIn_yGa_z$" will be understood to include a material containing these elements in a specific ratio given by x, y, and z (e.g. $Cu_{75}Ga_{25}$ contains 75 atomic % Cu and 25 atomic % Ga). The notation is extendable to other materials and other elemental combinations.

As used herein, the notation "$(Ag,Cu)_x(In,Ga)_y(Se,S,Te)_z$" will be understood to include a material containing a total amount of Group-IB elements (i.e. Ag plus Cu, etc.) in a ratio given by "x", a total amount of Group-IIIA elements (i.e. In plus Ga), etc. in a ratio given by "y", and a total amount of Group-VIA elements (i.e. Se plus S plus Te, etc.) in a ratio given by "z". The notation is extendable to other materials and other elemental combinations.

As used herein, "metal chalcogenide" or "chalcogenide" will be understood to represent the entire range of related compounds denoted by "MX" where M represents one or more metal elements and X represents one or more of the chalcogen elements (e.g. O, S, Se, or Te).

As used herein, "chalcogenize" and "chalcogenization" will be understood to represent the process by which one or more metals are converted to chalcogenide compounds by exposing the one or more metals to a chalcogen (e.g. O, S, Se, or Te) at elevated temperature (e.g. between 100 C and 700 C). Specifically, "selenization" will be understood to represent the process by which one or more metals are converted to selenide compounds by exposing the one or more metals to a Se source at elevated temperature (e.g. between 100 C and 700 C). Specifically, "sulfurization" will be understood to represent the process by which one or more metals are converted to sulfide compounds by exposing the one or more metals to a S source at elevated temperature (e.g. between 100 C and 700 C). In addition, "chalcogenize" or "chalcogenization" will be understood to represent the process by which a metal precursor is either partially or completely converted to the final multinary chalcogenide compound(s). Similarly, "chalcogenize" or "chalcogenization" will be understood to represent the process by which a precursor containing one or more chalcogenide materials with/without one or more elemental or alloy metals is converted to one or more dense, polycrystalline, desired multinary chalcogenide compound(s). It should be understood that the majority of the final film contains the desired multinary chalcogenide compound(s), yet a minority of the material might not be converted to the desired multinary chalcogenide compound(s).

As used herein, the terms "film" and "layer" will be understood to represent a portion of a stack. They will be understood to cover both a single layer as well as a multilayered structure (i.e. a nanolaminate). As used herein, these terms will be used synonymously and will be considered equivalent.

As used herein, "single grading" and "single gradient" will be understood to describe cases wherein a parameter varies throughout the thickness of a film or layer and further exhibits a smooth, quasilinear variation. Examples of suitable parameters used herein will include the atomic concentration of a specific elemental species (i.e. composition variation) throughout the thickness of a film or layer, and bandgap energy variation throughout the thickness of a film or layer.

As used herein, "double grading" and "double gradient" will be understood to describe cases wherein a parameter varies throughout the thickness of a film or layer and further exhibits a variation wherein the value of the parameter is smaller toward the middle of the film or layer with respect to either end of the film or layer. It is not a requirement that the value of the parameter be equivalent at the two ends of the film or layer. Examples of suitable parameters used herein will include the atomic concentration of a specific elemental species (i.e. composition variation) throughout the thickness of a film or layer, and bandgap energy variation throughout the thickness of a film or layer.

As used herein, "substrate configuration" will be understood to describe cases wherein the TFPV stack is built sequentially on top of a substrate and the light is assumed to be incident upon the top of the TFPV stack. As used herein, an "n-substrate" configuration will be used to denote that the n-type layer (i.e. buffer layer) is closest to the incident light. The n-substrate configuration is the most common. As used herein, a "p-substrate" configuration will be used to denote that the p-type layer (i.e. absorber layer) is closest to the incident light.

As used herein, "superstate configuration" will be understood to describe cases wherein the substrate faces the incident sunlight. The convention will be used wherein light is assumed to be incident upon the substrate. As used herein, an "n-superstrate" configuration will be used to denote that the n-type layer (i.e. buffer layer) is closest to the incident light. As used herein, a "p-superstrate" configuration will be used to denote that the p-type layer (i.e. absorber layer) is closest to the incident light.

As used herein, "substrate" will be understood to generally be one of float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. in all of the methods and examples described herein.

As used herein, "precursor layer", "precursor material", "metal precursor layer", "metal precursor material", etc. will be understood to be equivalent and be understood to refer to a metal, metal alloy, metal chalcogenide, etc. layer and/or material that is first deposited and will ultimately become the absorber layer of the TFPV device after full chalcogenization and/or further processing.

As used herein, "absorber layer", "absorber material", etc. will be understood to be equivalent and be understood to refer to a layer and/or material that is responsible for the charge generation in the TFPV device after full chalcogenization and/or further processing.

As used herein, the notations "Al:ZnO" and "ZnO:Al" will be understood to be equivalent and will describe a material wherein the base material is the metal oxide and the element separated by the colon, ":", is considered a dopant. In this example, Al is a dopant in a base material of zinc oxide. The notation is extendable to other materials and other elemental combinations.

As used herein, a "bandgap-increasing metal" will be understood to be a metal element that increases the bandgap when substituted for an element from the same periodic table Group in the absorber material. For example, substituting Ag for a portion of the Cu in a CIGS material will increase the bandgap. For example, increasing the relative amount of Ga versus indium in a CIGS material will increase the bandgap. For example, substituting Ag for a portion of the Cu in a CZTS material will increase the bandgap. For example, substituting Ge for a portion of the Sn in a CZTS material will increase the bandgap.

In various FIGURES below, a TFPV material stack is illustrated using a simple planar structure. Those skilled in the art will appreciate that the description and teachings to follow can be readily applied to any simple or complex TFPV solar cell structure, (e.g. a stack with (non-)conformal non-planar layers for optimized photon management). The drawings are for illustrative purposes only and do not limit the application of the present invention.

"Double grading" the bandgap of the CIGS absorber is a method known in the art to increase the efficiency of CIGS solar cells. In a CIGS absorber layer that has a double-graded bandgap profile, the bandgap of the CIGS layer increases toward the front surface and toward the back surface of the CIGS layer, with a bandgap minimum located in a center region of the CIGS layer. Double grading helps in reducing unwanted charge carrier recombination. The increasing bandgap profile at the back surface of the CIGS layer, (i.e., the absorber surface that is remote from the incident light in the substrate configuration), creates a back surface field, which reduces recombination at the back surface and enhances carrier collection. Generally, in the disclosure to follow, the description will apply to the "n-substrate" configuration for economy of language. However, those skilled in the art will understand that the disclosure is also equally applicable to either of the "p-substrate" or "n, p-superstrate" configurations discussed previously.

Co-evaporation is one technique known in the art for producing a double-graded bandgap in a CIGS absorber layer. The co-evaporation process can produce a "gallium (Ga) rich region" (i.e. increased Ga relative to the center region of the layer) at the front and/or back surfaces of a CIGS absorber layer and a gallium-poor region in the center of the CIGS absorber layer. However, co-evaporation is a relatively complex process that is not as economical or as easily implemented as other deposition processes known in the art. In a 2-step process, Cu—In—Ga metal precursors are deposited first, followed by a second selenization process to form a CIGS absorber layer. The 2-step process is generally more suited to large-scale low-cost manufacturing compared to the co-evaporation process. However, because gallium selenizes slower than indium under otherwise identical conditions, gallium tends to accumulate towards the back surface of the CIGS layer during the selenization process, thereby creating an uncontrolled single grading in the bandgap profile, i.e., the bandgap of the CIGS layer increases from the front surface to the back surface. Double grading of the bandgap profile is then typically achieved by the incorporation of sulfur (S) at the front surface of the CIGS layer for a 2-step process thereby creating CIGSSe. However, sulfur incorporation adds considerable complexity to the growth process and more easily produces a TFPV absorber material (copper-indium-gallium-selenium-sulfur) of lower quality compared to CIGSe without sulfur.

The efficiency of TFPV devices depends on many properties of the absorber layer and the buffer layer such as crystallinity, grain size, composition uniformity, density, defect concentration, doping level, surface roughness, etc.

The manufacture of TFPV devices entails the integration and sequencing of many unit processing steps. As an example, TFPV manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as TFPV devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching, texturing, polishing, cleaning, etc. HPC processing techniques have also been successfully adapted to deposition processes such as sputtering, atomic layer deposition (ALD), and chemical vapor deposition (CVD).

HPC processing techniques have been adapted to the development and investigation of absorber layers and buffer layers for TFPV solar cells as described in U.S. application Ser. No. 13/236,430 filed on Sep. 19, 2011, entitled "COMBINATORIAL METHODS FOR DEVELOPING SUPERSTRATE THIN FILM SOLAR CELLS" and is incorporated herein by reference. However, HPC processing techniques have not been successfully adapted to the development of contact structures for TFPV devices. Generally, there are two basic configurations for TFPV devices. The first configuration is known as a "substrate" configuration. In this configuration, the contact that is formed on or near the substrate is called the back contact. In this configuration, the light is incident on the TFPV device from the top of the material stack (i.e. the side opposite the substrate). CIGS TFPV devices are most commonly manufactured in this configuration. The second configuration is known as a "superstrate" configuration. In this configuration, the contact that is formed on or near the substrate is called the front contact. In this configuration, the light is incident on the TFPV device through the substrate. CdTe, and a-Si, TFPV devices are most commonly manufactured in this configuration. In both configurations, light trapping schemes may be implemented in the contact layer that is formed on or near the substrate. Additionally, other efficiency or durability improvements can be implemented in the contact layer that is formed farthest away from the substrate.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of TFPV manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a TFPV device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a TFPV device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the TFPV device. For example, such structures may include, but would not be limited to, contact layers, buffer layers, absorber layers, or any other series of layers or unit processes that create an intermediate structure found on TFPV devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
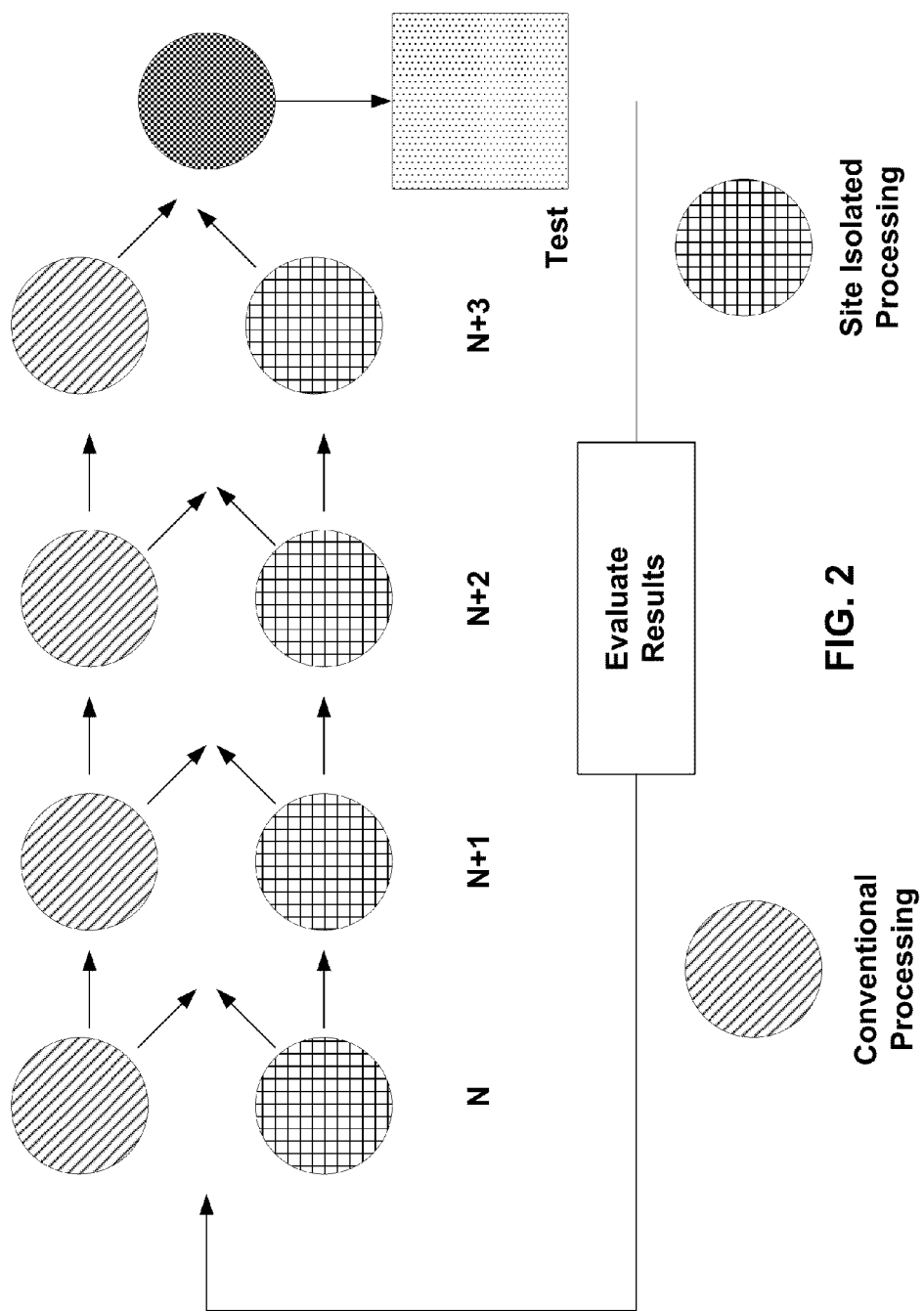
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. The combinatorial processing may employ uniform processing of site isolated regions or may employ gradient techniques. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in TFPV manufacturing may be varied.

As mentioned above, within a region, the process conditions are substantially uniform. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. However, in some embodiments, the processing may result in a gradient within the regions. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
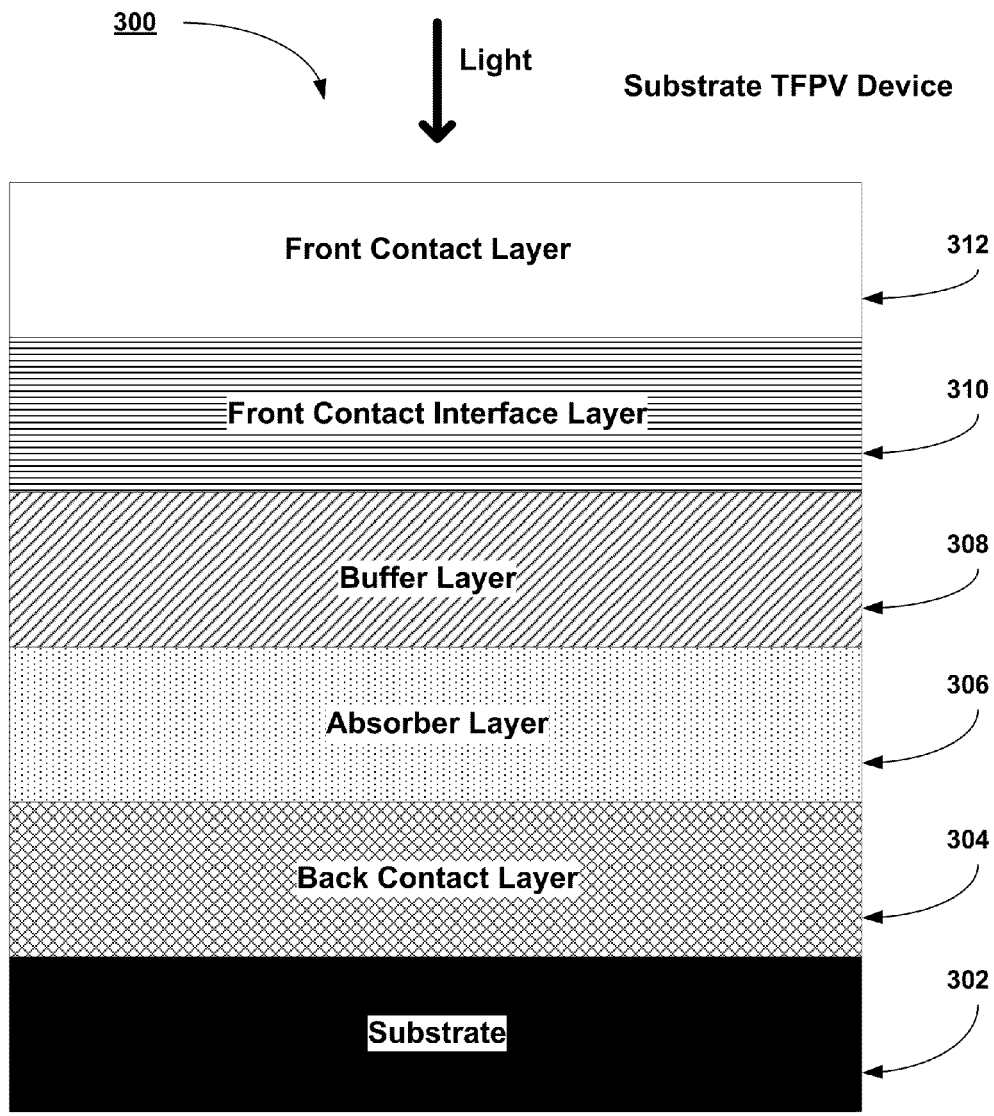
FIG. 3 illustrates a schematic diagram of a simple substrate TFPV stack according to an embodiment described herein.

FIG. 3 illustrates a schematic diagram of a simple TFPV device stack in the substrate configuration consistent with some embodiments of the present invention. The convention will be used wherein light is assumed to be incident upon the top of the material stack in the substrate configuration as illustrated. This generic diagram would be typical of a CIGS TFPV device. A back contact layer, 304, is formed on a substrate, 302. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. As used herein, the phrase "back contact" will be understood to be the primary current conductor layer situated between the substrate and the absorber layer in a substrate configuration TFPV device. An example of a common back contact layer material is Mo for CIGS TFPV devices. Other types of TFPV devices use different materials for the back contact. As an example, Cu alloys such as Cu/Au, Cu/graphite, Cu/Mo, Cu:ZnTe, etc. are typically used for CdTe TFPV devices and transparent conductive oxide (TCO) materials such as ZnO, ITO, $SnO_2$:F, etc. are typically used for a-Si TFPV devices. The back contact layer may be formed by any number of deposition technologies. Examples of suitable deposition technologies comprise physical vapor deposition (PVD) (e.g. sputtering), evaporation, chemical vapor deposition (CVD), atomic layer deposition (ALD), plating, printing, wet coating, etc. The thickness of the back contact layer is typically between about 0.3 um and about 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others.

Optionally, a diffusion barrier and/or adhesion-promotion layer (not shown) may be formed between the substrate and the back contact layer. When implemented, the diffusion barrier layer stops the diffusion of impurities from the substrate into the back contact layer, or alternatively, stops the diffusion and reaction of the back contact material with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. The diffusion barrier layer may be formed, partially or completely, from any well known technique such as sputtering, ALD, CVD, evaporation, wet methods such as printing or spraying of inks, screen printing, inkjet printing, slot die coating, gravure printing, wet chemical depositions, or from sol-gel methods, such as the coating, drying, and firing of polysilazanes.

A p-type absorber layer, 306, of CIGS is then deposited on top of the back contact layer. The absorber layer may be formed, partially or completely, using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the absorber growth. The Na may be added by out-diffusion from the SLG substrate or may be purposely added in the form of $Na_2Se$, NaF, sodium alloys of In and/or Ga, or another Na source, prior, during, or after the deposition and/or growth of the absorber layer. Optionally, the precursor and/or absorber layer undergoes a selenization process after formation to convert the precursor to CIGS into a high-quality CIGS semiconductor film. The selenization process involves the exposure of the precursor and/or absorber layer to $H_2Se$, $H_2S$, Se vapor, S vapor, or diethylselenide (DESe) at temperatures most typically between about 300 C and 700 C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary copper-gallium and Indium sputter targets. Nevertheless, plating and printing to deposit the metal precursor film containing Cu, In, and/or Ga are used as well. During the selenization process, a layer of $Mo(S,Se)_2$ (not shown) forms at the back contact/absorber layer interface and forms a fairly good ohmic contact between the two layers. Alternatively, a layer of $Mo(S,Se)_2$ (not shown) can be deposited at the back contact/absorber layer interface using a variety of well known techniques such as PVD (sputtering), CBD, ALD, plating, etc. The thickness of the absorber layer is typically between about 1.0 um and about 3.0 um. The performance of the absorber layer is sensitive to materials properties such as crystallinity, grain size, surface roughness, composition, defect concentration, etc. as well as processing parameters such as temperature, deposition rate, thermal treatments, etc.

An n-type buffer layer, 308, is then deposited on top of the absorber layer. Examples of suitable n-type buffer layers comprise CdS, ZnS, $In_2S_3$, $In_2(S,Se)_3$, CdZnS, ZnO, Zn(O, S), (Zn,Mg)O, etc. CdS is the material most often used as the n-type buffer layer in CIGS TFPV devices. The buffer layer may be deposited using chemical bath deposition (CBD), chemical surface deposition (CSD), PVD (sputtering), printing, plating, ALD, Ion-Layer-Gas-Reaction (ILGAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

Optionally, an intrinsic ZnO (iZnO) layer, 310, is then formed on top of the buffer layer. The iZnO layer is a high resistivity material and forms part of the transparent conductive oxide (TCO) stack that serves as part of the front contact structure. The TCO stack is formed from transparent conductive metal oxide materials and collects charge across the face of the TFPV solar cell and conducts the charge to tabs used to connect the solar cell to external loads. The iZnO layer makes the TFPV solar cell less sensitive to lateral non-uniformities caused by differences in composition or defect concentration in the absorber and/or buffer layers. The iZnO layer is typically between about 0 nm and 150 nm in thickness. The iZnO layer is typically formed using a (reactive) PVD (sputtering) technique or CVD technique, but can be deposited by plating or printing as well. A low resistivity top TCO layer, 312, (examples include Al:ZnO (AZO), InSnO (ITO), InZnO, B:ZnO, Ga:ZnO, F:ZnO, $F:SnO_2$, etc.) is formed on top of the iZnO layer. The top TCO layer is typically between about 0.25 um and 1.0 um in thickness. The top TCO layer is typically formed using a (reactive) PVD (sputtering) technique or CVD technique. Optionally, the transparent top electrode can be printed or wet-coated from (silver) nano-wires, carbon nanotubes, and the like.

Figure 4:
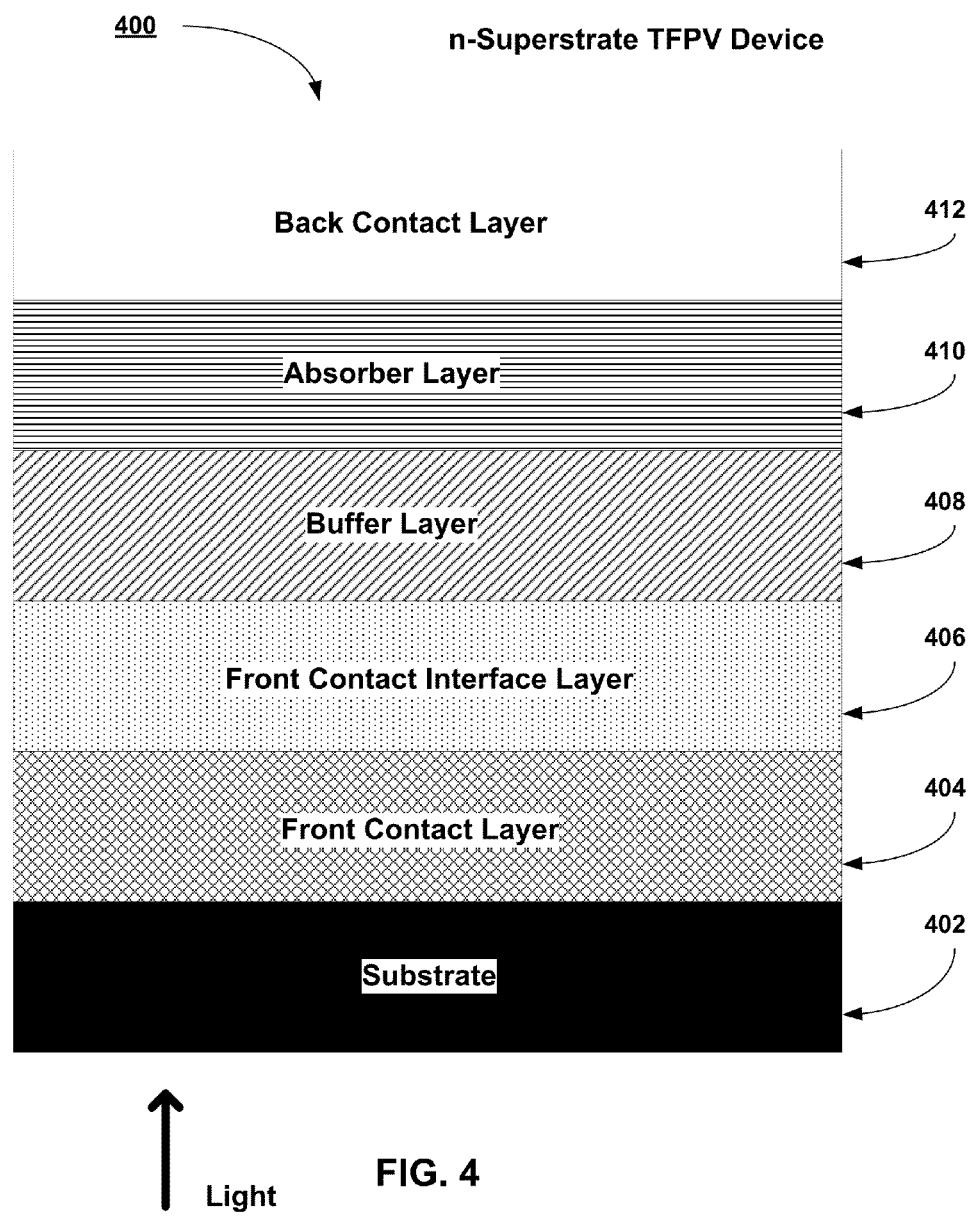
FIG. 4 illustrates a schematic diagram of a simple superstrate TFPV stack according to an embodiment described herein.

FIG. 4 illustrates a simple CIGS TFPV device material stack, 400, consistent with some embodiments of the present invention. The CIGS TFPV device illustrated in FIG. 4 is shown in a superstrate configuration wherein the glass substrate faces the incident sunlight. The convention will be used wherein light is assumed to be incident upon the substrate and material stack as illustrated. As used herein, this configuration will be labeled an "n-superstrate" configuration to denote that the n-type layer (i.e. buffer layer) is closest to the incident light. This label is to distinguish the configuration from an alternate configuration described with respect to FIG. 5 below. The formation of the CIGS TFPV device will be described starting with the substrate. Examples of suitable substrates comprise float glass, low-iron glass, borosilicate glass, flexible glass, specialty glass for high temperature processing, polyimide, plastics, etc. Furthermore, the substrates may be processed in many configurations such as single substrate processing, multiple substrate batch processing, in-line continuous processing, roll-to-roll processing, etc.

A low resistivity bottom TCO front contact layer, 404, (examples include Al:ZnO (AZO), InSnO (ITO), InZnO, B:ZnO, Ga:ZnO, F:ZnO, $F:SnO_2$, etc.) is formed on top of the substrate, 402. As used herein, the phrase "front contact" will be understood to be the primary current conductor layer situated between the substrate and the buffer layer in a superstrate configuration TFPV device. The bottom TCO layer is typically between about 0.3 um and 2.0 um in thickness. The bottom TCO layer is typically formed using a reactive PVD (sputtering) technique or CVD technique.

Optionally, a diffusion barrier and/or adhesion-promotion layer (not shown) may be formed between the substrate, 402, and the front contact layer, 404. When implemented, the diffusion barrier layer stops the diffusion of impurities from the substrate into the TCO, or alternatively, stops the diffusion and reaction of the TCO material and above layers with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. It should be understood that the diffusion barrier layer composition and thickness are optimized for optical transparency as necessary for the superstrate configuration. The diffusion barrier layer may be formed from any well known technique such as sputtering, ALD, CVD, evaporation, wet methods such as printing or spraying of inks, screen printing, inkjet printing, slot die coating, gravure printing, wet chemical depositions, or from sol-gel methods, such as the coating, drying, and firing of polysilazanes.

An intrinsic iZnO layer, 406, is then formed on top of the TCO layer. The iZnO layer is a high resistivity material and forms part of the transparent conductive oxide (TCO) stack that serves as part of the front contact structure. The iZnO layer makes the TFPV device less sensitive to lateral non-uniformities caused by differences in composition or defect concentration in the absorber and/or buffer layers. The iZnO layer is typically between about 0 nm and 150 nm in thickness. The iZnO layer is typically formed using a reactive PVD (sputtering) technique or CVD technique.

An n-type buffer layer, 408, is then deposited on top of the iZnO layer, 406. Examples of suitable n-type buffer layers comprise CdS, ZnS, $In_2S_3$, $In_2(S,Se)_3$, CdZnS, ZnO, Zn(O,S), (Zn,Mg)O, etc. CdS is the material most often used as the n-type buffer layer in CIGS TFPV devices. The buffer layer may be deposited using chemical bath deposition (CBD), chemical surface deposition (CSD), PVD (sputtering), printing, plating, ALD, Ion-Layer-Gas-Reaction (ILGAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

A p-type absorber layer, 410, of CIGS is then deposited on top of the buffer layer. The absorber layer may be formed, partially or completely, using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the growth of the absorber. The Na may be purposely added in the form of $Na_2Se$ or another Na source, prior, during, or after the deposition and/or growth of the absorber layer. Optionally, the precursor and/or absorber layer undergoes a selenization process after formation to convert the precursor to CIGS into a high-quality CIGS semiconductor film. The selenization process involves the exposure of the precursor and/or absorber layer to $H_2Se$, $H_2S$, Se vapor, S vapor, or diethylselenide (DESe) at temperatures most typically between about 300 C and 700 C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary Cu—Ga and In sputter targets. Nevertheless, plating and printing to deposit the metal precursor film containing Cu, In, and/or Ga are used as well. During subsequent processing, a layer of $Mo(S,Se)_2$ (not shown) is formed at the back contact/absorber layer interface and forms a fairly good ohmic contact between the two layers. The thickness of the absorber layer is typically between about 1.0 um and about 3.0 um. The performance of the absorber layer is sensitive to materials properties such as crystallinity, grain size, surface roughness, composition, defect concentration, etc. as well as processing parameters such as temperature, deposition rate, thermal treatments, etc.

A back contact layer, 412, is formed on absorber layer, 410. An example of a common back contact layer material is Mo for CIGS TFPV devices. The back contact layer may be formed by any number of deposition technologies. Examples of suitable deposition technologies comprise PVD (sputtering), evaporation, chemical vapor deposition (CVD), atomic layer deposition (ALD), plating, etc. The thickness of the back contact layer is typically between about 0.3 um and about 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others. Other types of TFPV devices use different materials for the back contact. As an example, Cu alloys such as Cu/Au, Cu/graphite, Cu/Mo, Cu:ZnTe, etc. are typically used for CdTe TFPV devices and TCO materials such as ZnO, ITO, $SnO_2$:F, etc. are typically used for a-Si TFPV devices.

Figure 5:
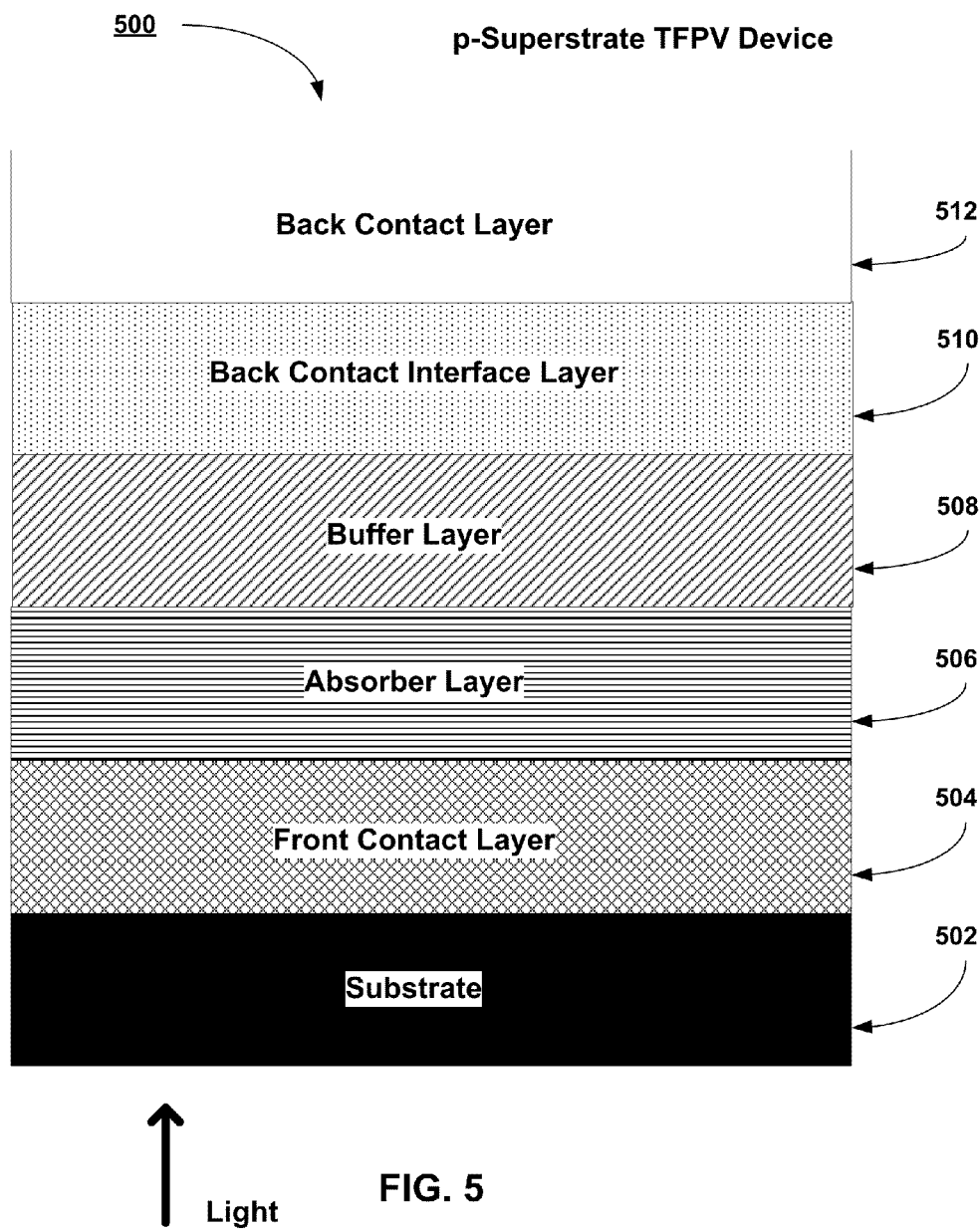
FIG. 5 illustrates a schematic diagram of a simple superstrate TFPV stack according to an embodiment described herein.

FIG. 5 illustrates a simple CIGS TFPV device material stack, 500, consistent with some embodiments of the present invention. The CIGS TFPV device illustrated in FIG. 5 is shown in a superstrate configuration wherein the glass substrate faces the incident sunlight. The convention will be used wherein light is assumed to be incident upon the substrate and material stack as illustrated. As used herein, this configuration will be labeled a "p-superstrate" configuration to denote that the p-type layer (i.e. absorber layer) is closest to the incident light. This label is to distinguish the configuration from the alternate configuration described with respect to FIG. 4 previously. The formation of the CIGS TFPV device will be described starting with the substrate. Examples of suitable substrates comprise float glass, low-iron glass, borosilicate glass, flexible glass, specialty glass for high temperature processing, polyimide, plastics, etc. Furthermore, the substrates may be processed in many configurations such as single substrate processing, multiple substrate batch processing, in-line continuous processing, roll-to-roll processing, etc.

A low resistivity bottom TCO front contact layer (examples include Al:ZnO (AZO), InSnO (ITO), InZnO, B:ZnO, Ga:ZnO, F:ZnO, $F:SnO_2$, etc.), 504, is formed on top of the substrate, 502. As used herein, the phrase "front contact" will be understood to be the primary current conductor layer situated between the substrate and the absorber layer in a superstrate configuration TFPV device. The bottom TCO layer is typically between about 0.3 um and 2.0 um in thickness. The bottom TCO layer is typically formed using a reactive PVD (sputtering) technique or CVD technique. The TCO can be a p-type TCO, (e.g. ternary-based oxide in the family of $Co_3O_4$-based spinels, like $Co_2ZnO_4$ and $Co_2NiO_4$). Nevertheless, it should be understood that an n-type TCO with an additional layer (e.g. a heavily-doped p-type semiconductor layer, or $MoSe_2$) between the TCO and the absorber can be used as well. Furthermore, the TCO might be a bi- or multi-layer of an n-type TCO in contact with the substrate, followed by an ultrathin metal layer, (e.g. like Ag), followed by a thin p-type TCO in contact with the absorber layer, with/without an additional $MoSe_2$ layer between the p-type TCO and the absorber layer.

Optionally, a diffusion barrier and/or adhesion-promotion layer (not shown) may be formed between the substrate, 502, and the front contact layer. 504. When implemented, the diffusion barrier and/or adhesion-promotion layer stops the diffusion of impurities from the substrate into the TCO, or alternatively, stops the diffusion and reaction of the TCO material and above layers with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. It should be understood that the diffusion barrier and/or adhesion-promotion layer composition and thickness are optimized for optical transparency as necessary for the superstrate configuration. The diffusion barrier and/or adhesion-promotion layer may be formed from any well known technique such as sputtering, ALD, CVD, evaporation, wet methods such as printing or spraying of inks, screen printing, inkjet printing, slot die coating, gravure printing, wet chemical depositions, or from sol-gel methods such as the coating, drying, and firing of polysilazanes.

A p-type absorber layer, 506, of CIGS is then deposited on top of the front contact layer. The absorber layer may be formed, partially, or completely, using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the growth of the absorber. The Na may be purposely added in the form of $Na_2Se$ or another Na source, prior, during, or after the deposition of the precursor and/or absorber layer. Typically, the precursor and/or absorber layer undergoes a chalcogenization (e.g. selenization) process after formation to convert the precursor to CIGS into a high-quality CIGS semiconductor film. The chalcogenization process involves the exposure of the precursor and/or absorber layer to $H_2Se$, $H_2S$, Se vapor, S vapor, or diethylselenide (DESe) at temperatures most typically between about 300 C and 700 C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary copper-gallium and Indium sputter targets. Nevertheless, plating and printing to deposit the metal precursor film containing Cu, In, and/or Ga are used as well. The thickness of the absorber layer is typically between about 1.0 um and about 3.0 um. The performance of the absorber layer is sensitive to materials properties such as crystallinity, grain size, surface roughness, composition, defect concentration, etc. as well as processing parameters such as temperature, deposition rate, thermal treatments, etc.

An n-type buffer layer, 508, is then deposited on top of the absorber layer. Examples of suitable n-type buffer layers comprise CdS, ZnS, $In_2S_3$, $In_2(S,Se)_3$, CdZnS, ZnO, Zn(O, S), (Zn,Mg)O, etc. CdS is the material most often used as the n-type buffer layer in CIGS TFPV devices. The buffer layer may be deposited using chemical bath deposition (CBD), chemical surface deposition (CSD), PVD (sputtering), printing, plating, ALD, Ion-Layer-Gas-Reaction (ILGAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

An intrinsic iZnO layer, 510, is then formed on top of the buffer layer. The iZnO layer is a high resistivity material and forms part of the back contact structure. The iZnO layer makes the TFPV device less sensitive to lateral non-uniformities caused by differences in composition or defect concentration in the absorber and/or buffer layers. The iZnO layer is typically between about 0 nm and 150 nm in thickness. The iZnO layer is typically formed using a reactive PVD (sputtering) technique or CVD technique.

A back contact layer, 512, is formed on intrinsic iZnO layer, 510. An example of a suitable back contact layer material is a thin n-type TCO followed by Ni and/or Al. The back contact layer may be formed by any number of deposition technologies. Examples of suitable deposition technologies comprise PVD (sputtering), evaporation, chemical vapor deposition (CVD), atomic layer deposition (ALD), plating, etc. The thickness of the back contact layer is typically between about 0.3 um and about 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others. Other types of TFPV devices use different materials for the back contact. As an example, Cu alloys such as Cu/Au, Cu/graphite, Cu/Mo, Cu:ZnTe, etc. are typically used for CdTe TFPV devices and TCO materials such as ZnO, ITO, $SnO_2$:F, etc. are typically used for a-Si TFPV devices.

The film stack described above is just one example of a film stack that can be used for TFPV devices. As an example, another substrate film stack (i.e. similar configuration as FIG. 3) might be: substrate/AZO/Mo/CIGS/CdS/iZnO/AZO. As an example, another p-superstrate film stack (i.e. similar configuration as FIG. 5) might be: substrate/barrier/ZnO:Al/Mo/CIGS/CdS/iZnO/ZnO:Al/Al. The detailed film stack configuration is not meant to be limiting, but simply serves as an example of the implementation of embodiments of the present invention.

Figure 6:
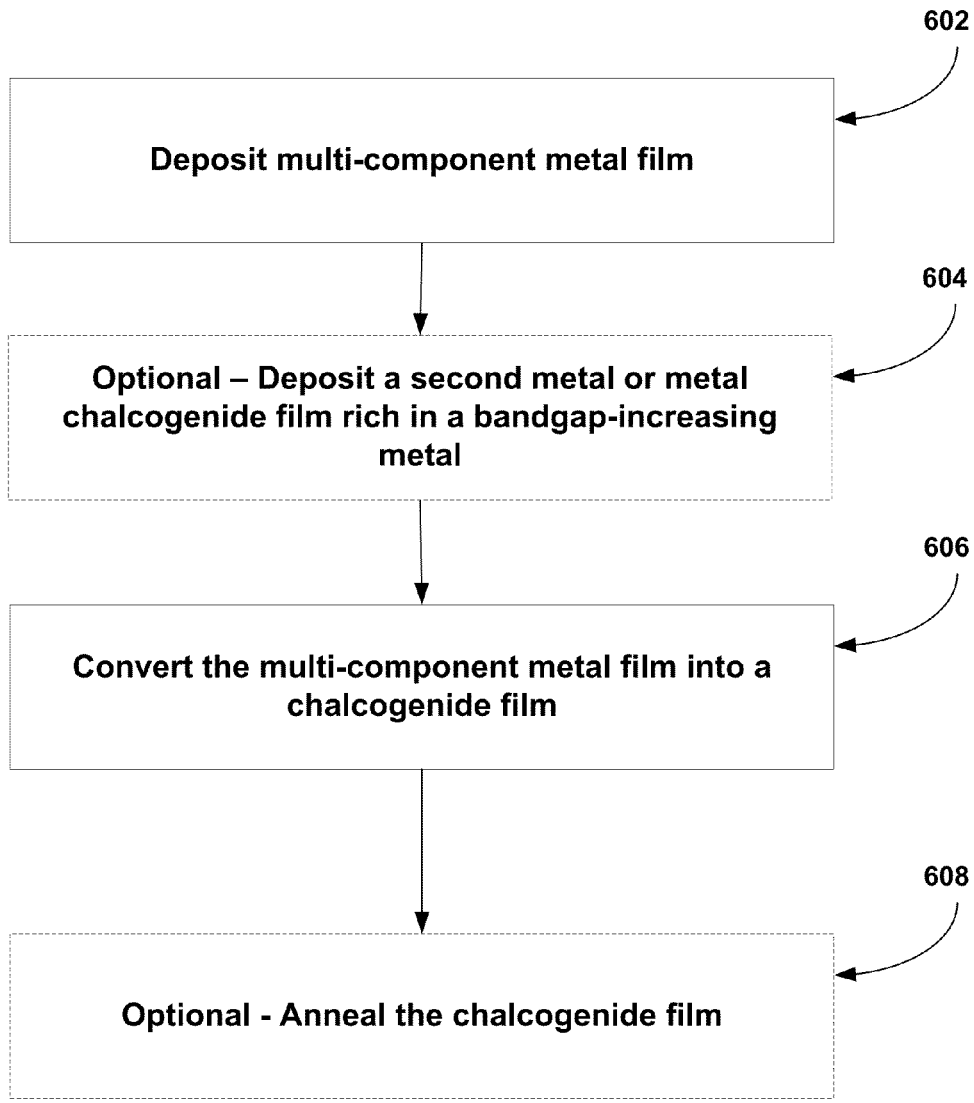
FIG. 6 illustrates a flow chart according to some embodiments.

The formation of the absorber layer is typically a multi-step process. One way of grading CIGS materials is by a 2-step approach as illustrated in FIG. 6. In step 602, "metal precursor" films are deposited. For CIGS-like absorbers, the metal precursor films comprise Group IB and Group-IIIA metals. In the case of CIGS absorbers, the metal precursor films comprise Cu, In, and Ga, with/without a Na source. This metal film needs to be converted to one or more chalcogenide compound(s) to form the absorber layer. The metal precursor film is converted to one or more chalcogenide compound(s) by heating the film in the presence of a source of one or more Group-VIA elements as indicated in step 606. Optionally, the chalcogenide film can be annealed as indicated in step 608. For CIGS-type absorbers, a variation of the 2-step process comprises depositing a second thin Group-IIIA-containing film or Group-IIIA chalcogenide material (e.g. Ga—Se, or Al—Se) on top of the metal precursor film as illustrated in step 604. The Group-IIIA metal is bound in the chalcogenide, its diffusion (e.g. Ga, or Al) toward the back of the absorber layer is retarded, yielding a higher concentration of the Group-IIIA metal at the front of the absorber layer. This results in a double-graded composition of the Group-IIIA metal and a double-graded bandgap.

Generally, the 2-step method may comprise more than two steps when various wet chemical and/or conversion methods (e.g. for densification or contaminant removal) and/or deposition steps (e.g. for a separate chalcogen layer as discussed previously) are used to form the metal precursor film. As discussed above, the metal precursor film may be a single layer or may be formed from multiple layers, it may be dense or porous.

The highest efficiencies for 2-step CIG(S)Se have been achieved by converting PVD (sputtered) Cu(In,Ga) into CIG(S)Se by a chalcogenization process where the Cu(In,Ga) film is both selenized and sulfurized, meaning the final absorber (CIGSSe) contains both selenium and sulfur. Unfortunately, CIG(S)Se formed using a 2-step process has not yet achieved >20% efficiency, and lags ~2% behind the laboratory champion of CIGSe. This is mainly due to the fact that it is challenging to control both bandgap grading and maintain a high minority carrier lifetime when sulfur is introduced.

Unfortunately, the traditional 2-step approach based on Cu(In,Ga) followed by selenization (without introducing sulfur) has so far only resulted in flat bandgap profiles, or single-graded CIGSe, resulting in efficiencies <16.0%.

It should be noted that the above cited efficiencies are laboratory champion efficiencies for ~0.5 cm$^2$ solar cells, not to be confused with commercially available, average, solar panel efficiencies which are typically 5-6% lower than laboratory champions, due to a combination of non-uniformity within solar cells, mismatch between series-connected cells, absorption losses in thick TCO layers, encapsulant, and glass, scribe and edge losses, and additional series resistance, all in addition to running a different process in the factory compared to the laboratory.

One of the main challenges for 2-step selenization is to control the phase separation in the Cu-poor film. High efficiency CIG(S)Se requires a Cu-poor (p-type) CIGSe film. Cu-poor Cu(In,Ga) metal films prior to chalcogenization are multi-phasic (2 or more separate phases present in the film), and as such, are hard to deposit in a homogeneous fashion that provides a conformal, smooth, uniform Cu(In,Ga) film, especially, due to the fact that indium-rich phases have the tendency to agglomerate due to poor wetting of underlying surfaces. Laterally uniform Cu(In,Ga) and Cu(In,Ga)Se$_2$ films are needed to avoid the formation of weak diodes that reduce the overall solar cell efficiency.

The agglomeration of indium is typically minimized by reducing the dynamic deposition rate, and/or controlling the substrate temperature during PVD, and/or introducing a multi-layer stack of alternating layers of In-rich and Cu-rich layers, all resulting in additional Capital Expenditure (CapEx). Other approaches try to avoid the phase separation by depositing a chalcogenide precursor film by PVD from binary, or multinary chalcogenide targets which results in a CapEx investment typically >3× higher than for PVD-CIG due to the deposition of a film ~3× thicker with a lower dynamic deposition rate. In addition, direct material costs for the chalcogenide targets are higher than for the metallic targets.

A second challenge for 2-step selenization is to control bandgap grading in depth in the final CIGSe film by Ga/(In+Ga) compositional grading. Ga-rich phases selenize slower than Cu and In, and therefore, most of the Ga collects at the back of the CIGSe film resulting in a single-graded CIGSe film. One way to avoid this Ga migration and maintain a flat Ga distribution is to extend the selenization time (>30 min), and go to high temperatures (550-600 C), not compatible with all low-temperature, low-cost substrates. Furthermore, this has not resulted in any double-graded CIGSe (>20%).

A third challenge for 2-step selenization is to prevent adhesion failure of the CIGSe film due to stress resulting from the expansion from Cu(In,Ga) to CIGSe at elevated temperature. The expansion from the metal film to the chalcogenide film can be 2.5-3.0× in volume. Additionally, the overall stack of layers may have very different coefficients of thermal expansion, thickness, and Young's modulus.

Figure 7:
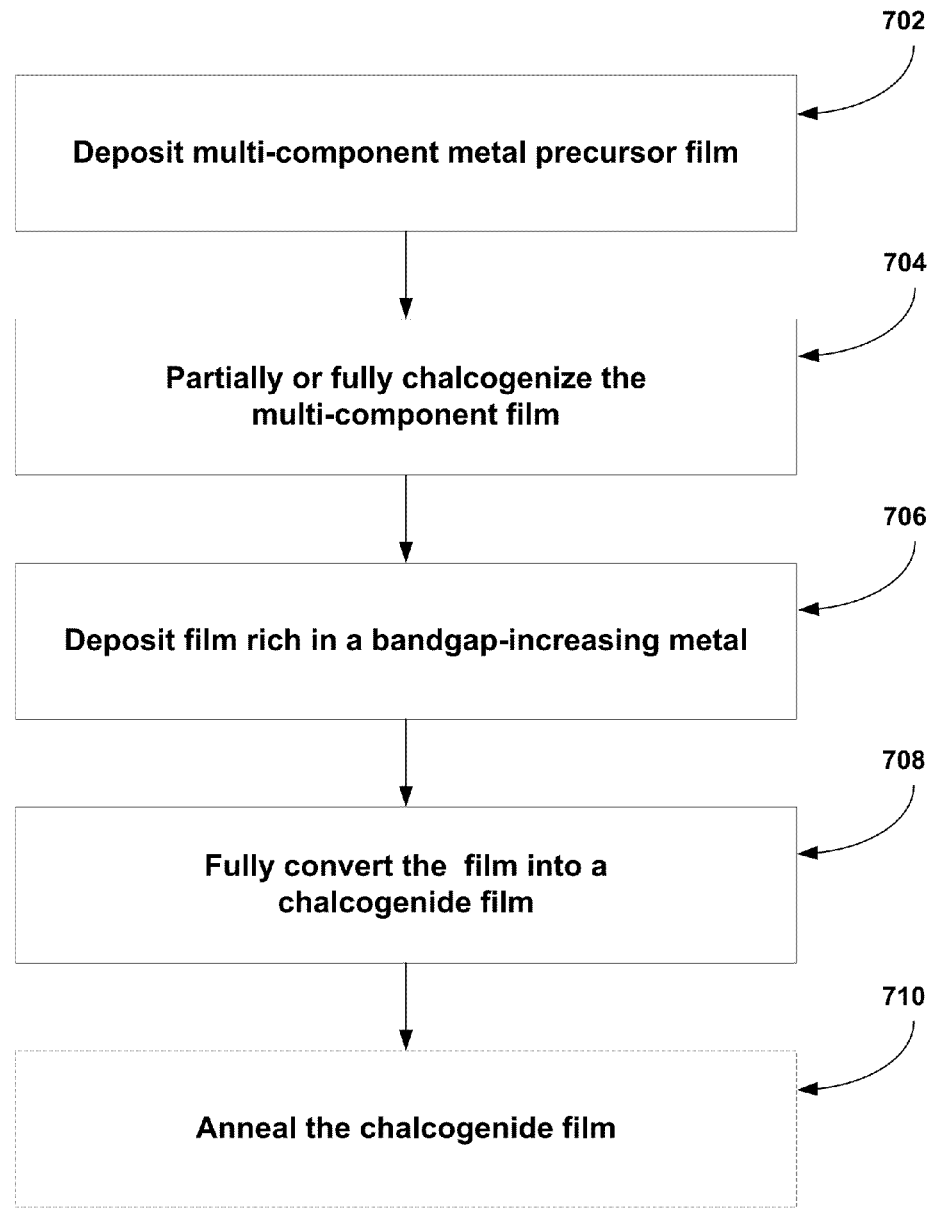
FIG. 7 illustrates a flow chart according to some embodiments.

A second way of grading CIGS materials is by a 4-step approach as illustrated in FIG. 7. In step 702, "metal precursor" films are deposited. For CIGS-like absorbers, the metal precursor films comprise Group IB and Group-IIIA metals. In the case of CIGS absorbers, the metals comprise Cu, In, and Ga, with/without a Na source. This metal precursor film needs to be converted to a chalcogenide to form the absorber layer. The metal precursor film is converted (partially or fully) to a chalcogenide by heating the film in the presence of a source of one or more Group-VIA elements as indicated in step 704. As used herein, it will be understood that "partially converted" will be understood to mean that at least a portion of the metal precursor film is converted to a chalcogenide through exposure to a chalcogen at elevated temperature. In step 706, a layer rich in a bandgap-increasing metal (relative to the metal precursor film deposited in step 702) is formed on the surface of the partially or fully chalcogenized precursor film. For example, if the metal precursor film deposited in step 702 is a Cu—In—Ga material, then at least one of Ga/(Ga+In) or Ag/(Ag+Cu) is greater in the layer deposited in step 706 than in the metal precursor film deposited in step 702. In step 706, the layer rich in a bandgap-increasing metal may be a metal, a metal alloy, or a metal chalcogenide material (e.g. metal oxide, metal sulfide, metal selenide, metal telluride, etc.). In step 708, the entire precursor stack to form the final absorber is converted using a chalcogenization process. The chalcogenization process may include an additional anneal step at the end to improve the device performance as illustrated in step 710. Details of a chalcogenization process including an additional anneal step are described in U.S. patent application Ser. No. 13/283,225, entitled "Method of Fabricating CIGS by Selenization at High Temperatures", filed on Oct. 27, 2011, which is herein incorporated by reference.

Generally, the 4-step method may comprise more than 4 steps when various wet chemical and/or conversion methods (e.g. for densification or contaminant removal) and/or deposition steps are used to form the metal precursor film and/or the metal rich layer. As discussed above, the metal precursor film and/or the metal rich layer may each be a single layer or may each be formed from multiple layers, it may be dense or porous.

In each of the multi-step methods described above and the examples to be disclosed below, a metal precursor film(s) is deposited. Typically, the precursor material will deviate in shape, size, composition, homogeneity, crystallinity, or some combination of these parameters from the absorber material that is ultimately formed as a result of the method. As mentioned previously, the metal precursor film(s) can comprise multiple layers. These layers may be deposited by the same or by different deposition techniques. These layers can be porous, or dense.

The metal precursor film(s) can be deposited using a number of techniques. Examples comprise dry deposition techniques such as batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, etc.

The efficiency of a TFPV device depends on the bandgap of the absorber material. The goal is to have the bandgap tuned to the energy range of the photons incident on the device. The theoretical upper limit for a single p-n junction solar cell has been calculated to be about 33 to 34%. The peak in the efficiency occurs for values of the bandgap between about 1.0 eV and about 1.5 eV, and more specifically between about 1.3 eV and about 1.5 eV. The bandgap for CIGSe films varies smoothly from CISe=1.00 (i.e. Ga/(Ga+In)=0.0) to CGSe=1.68 (i.e. Ga/(Ga+In)=1.0). The region of interest is from Ga/(Ga+In)=0.4 (~1.23 eV) to Ga/(Ga+In)=0.7 (~1.45 eV).

Another problem typically encountered during selenization is the difficulty to control the degree of selenization at higher temperatures. The selenization reaction of CIGSe occurs at temperatures above about 350 if the Se source is $H_2Se$. In an exemplary batch furnace, the ramp rates are generally limited to about 10 C/min by hardware. Those skilled in the art will understand that parameters such as ramp rates and temperature uniformity within processing equipment depend on the details of the equipment and that exemplary values used herein are not limiting. If the furnace temperature is increased to 600 C, delamination at the Mo/CIGSe interface is observed due to over-selenization and formation of a thick $MoSe_2$ layer. In some embodiments of the present invention, a fast gas exchange step is introduced at the high temperature step to replace $H_2Se$ in the furnace with an inert gas such as Ar, $N_2$, etc. to stop further selenization. This resolves the delamination problem due to over-selenization by limiting the formation of the $MoSe_2$ layer. Details of the fast gas exchange process are described in U.S. patent application Ser. No. 13/283,225 entitled "Method of Fabricating CIGS by Selenization at High Temperature" filed on Oct. 27, 2011 and is herein incorporated by reference.

Figure 8:
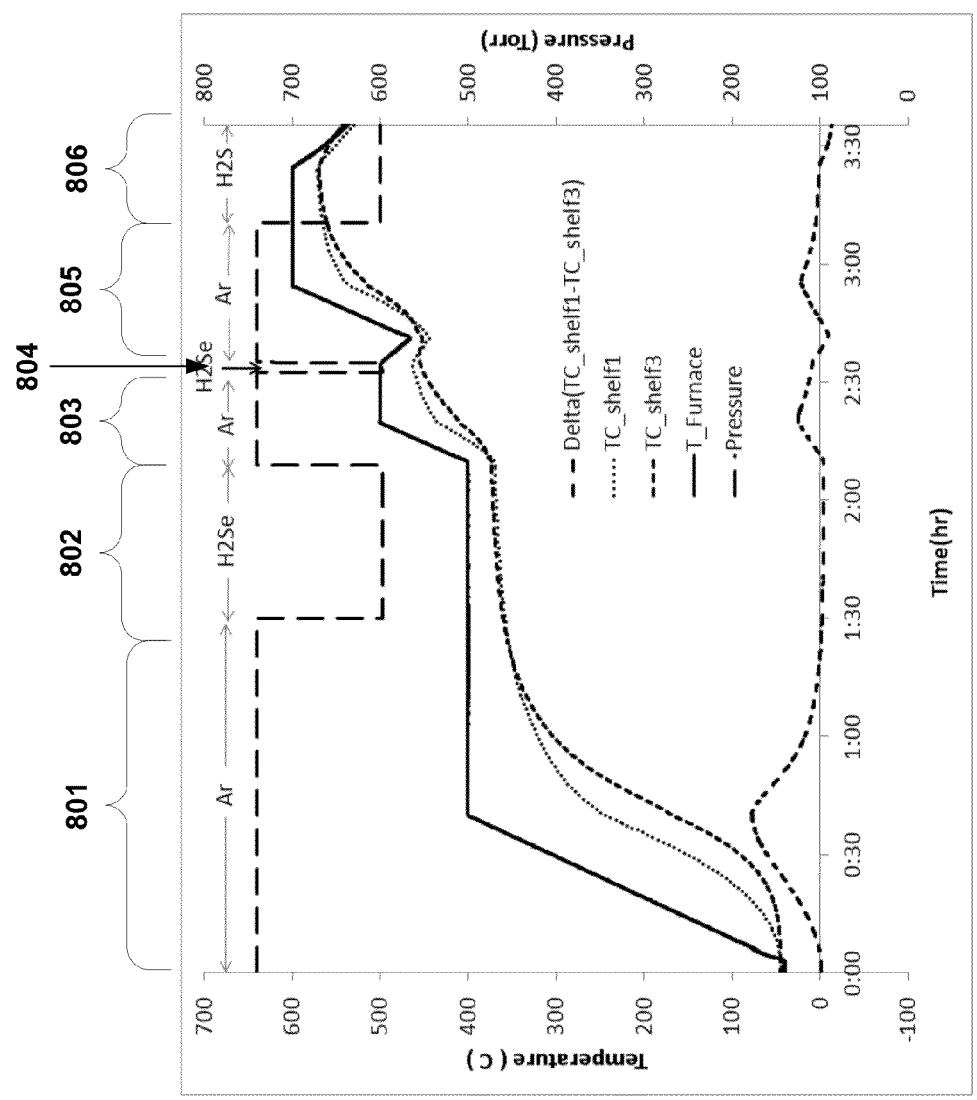
FIG. 8 illustrates a diagram depicting the temperature, temperature uniformity, gas flows, and chamber pressure during a selenization process according to some embodiments.

FIG. 8 illustrates a diagram depicting the temperature, temperature uniformity, gas flows, and chamber pressure during an exemplary selenization/sulfurization process. Details of the selenization process are described in U.S. patent application Ser. No. 13/461,495 entitled "Method of Uniform Selenization and Sulfurization in a Tube Furnace" filed on May 1, 2012 and is herein incorporated by reference for all purposes. Those skilled in the art will understand that parameters such as flow rates, gas composition, ramp rates, and temperature uniformity within processing equipment depend on the details of the equipment and that exemplary values used in the discussion to follow are not limiting. The Cu—In—Ga precursor film may be a blanket film covering the entire substrate or may comprise a plurality of site isolated regions wherein the composition of the Cu—In—Ga precursor film has been varied in a combinatorial manner as discussed previously. The uniformity of the selenization/sulfurization process is largely determined by the temperature uniformity within the furnace. The temperature non-uniformity between the shelves in the furnace is illustrated by the curve labeled "Delta(TC_shelf1–TC_shelf3)". It is noted that the non-uniformity is large during temperature ramp steps from one temperature to the next temperature. If the precursor film is exposed to a source of Se during these periods, the selenization of the film would be non-uniform and the device performance would be poor. This non-uniformity may be addressed by limiting the exposure to a source of Se during periods of high temperature non-uniformity and by adjusting the ramp rate of the furnace to maintain a temperature non-uniformity across the substrate of less than about 10 C. However, in the absence of a source of Se, indium will diffuse and agglomerate. In some embodiments, the precursor film is exposed to an inert gas flow (i.e. Ar) during the temperature ramp steps, denoted by time period 801 in FIG. 8. To decrease the indium agglomeration, the pressure within the furnace is increased to between about 1 atmosphere and about 2 atmospheres during temperature ramp steps. A pressure of 1 atmosphere has been illustrated in FIG. 8. The target temperature range for time period 801 is between about 350 C and about 450 C, and preferably between about 400 C and about 450 C. The temperature setpoint in FIG. 8 for time period 801 has been illustrated as 400 C.

Once the temperature has stabilized, the pressure in the furnace is reduced to between about 600 Torr and 700 Torr and the precursor film is exposed to a source of Se (e.g. $H_2Se$, diethylselenide (DESe), Se vapor, etc.). In this case, the source of Se is $H_2Se$, denoted by time period 802 in FIG. 8. An exemplary concentration of the $H_2Se$ is about 1 molar % $H_2Se$ in Ar. The temperature uniformity within the furnace is acceptable during this step and the selenization/sulfurization process will also be uniform.

As illustrated in FIG. 8, the furnace is then ramped to an intermediate temperature of between about 450 C and about 550 C, denoted by time period 803 in FIG. 8. The temperature setpoint in FIG. 8 for time period 803 has been illustrated as 500 C. As before, during this time, the CIGS film is not exposed to a source of Se. The furnace is filled with an inert gas (i.e. Ar) and the pressure within the furnace is increased to between about 1 atmosphere and about 2 atmospheres during temperature ramp steps. A pressure of 1 atmosphere has been illustrated in FIG. 8.

In some embodiments, it is advantageous to expose the CIGS film to a second selenization/sulfurization process, denoted by time period 804 in FIG. 8. This step completes the selenization/sulfurization of the film. As before, the pressure in the furnace is reduced to between about 600 Torr and 700 Torr and the precursor film is exposed to a source of Se (e.g. $H_2Se$, diethylselenide (DESe), Se vapor, etc.). In this case, the source of Se is $H_2Se$. The higher temperature results in increased crystallinity, larger grains, and improved optoelectronic performance. To prevent the over-selenization of the film, a fast gas exchange step is introduced near the beginning of the high temperature step. In this process, the $H_2Se$ flow is stopped and the $H_2Se$ gas within the chamber is quickly removed through a combination of an increased inert gas purge and pumping capacity.

As illustrated in FIG. 8, the furnace is then ramped to a final temperature of between about 550 C and about 650 C to anneal the film, denoted by time period 805 in FIG. 8. As before, during this time, the CIGS film is not exposed to a source of Se. The furnace is filled with an inert gas (i.e. Ar) and the pressure within the furnace is increased to between about 1 atmosphere and about 2 atmospheres during temperature ramp steps. A pressure of 1 atmosphere has been illustrated in FIG. 8. The purpose of this anneal step is mainly to allow the indium and gallium to interdiffuse within the film.

In some embodiments, it is advantageous to expose the CIGS film to an optional sulfurization process, denoted by time period 806 in FIG. 8. This step completes the sulfurization of the film. As before, the pressure in the furnace is reduced to about 600 Torr and the precursor film is exposed to a source of S. In this case, the source of S is $H_2S$.

In some embodiments of the present invention, the methods are implemented on a rapid thermal processing (RTP) system configuration. In an RTP system, the temperature of the substrates is increased and controlled through the use of lamp heaters while the substrates reside in a process chamber. The chambers may operate at pressures above atmospheric pressure or may operate at pressures below atmospheric pressure.

In some embodiments of the present invention, substrates are loaded into a RTP chamber that raises the temperature of the substrate from about room temperature to between about 350 C and about 450 C, and preferably to between about 400 C and about 450 C, in the presence of Ar at a pressure between about 1 atmosphere and about 2 atmospheres. After reaching the desired temperature, the substrates are held at that temperature until the substrates reach thermal equilibrium. The slow ramp and soak at low temperature ensures that the substrate and the deposited Cu—In—Ga metal precursor film do not suffer from thermal shock and that the temperature is uniform. In the next step, the precursor film is exposed to about 1 molar % $H_2Se$ in Ar at a pressure of less than 1 atmosphere and the Cu—In—Ga metal precursor film is partially selenized for a period of time. This step secures the indium in a selenized state and helps to prevent agglomeration. In the next step, the temperature is raised to between about 500C and about 550C and the Cu—In—Ga metal precursor film selenized for a period of time. The higher temperature is possible due to the earlier reaction of the In with the $H_2Se$ during the initial low temperature partial selenization step. The higher temperature results in increased crystallinity, larger grains, and improved optoelectronic performance. To prevent the over-selenization of the film, a fast gas exchange step is introduced near the beginning of the high temperature step. In this process, the $H_2Se$ flow is stopped and the $H_2Se$ gas within the chamber is quickly removed through a combination of an increased inert gas purge and pumping capacity. The CIGS film can be annealed at between about 550 C and about 650 C to influence the Ga distribution throughout the depth of the film.

In some embodiments, it is advantageous to expose the CIGS film to an optional sulfurization process. This step completes the sulfurization of the film. As before, the pressure in the RTP is reduced and the precursor film is exposed to a source of S. In this case, the source of S can be $H_2S$.

Figure 9:
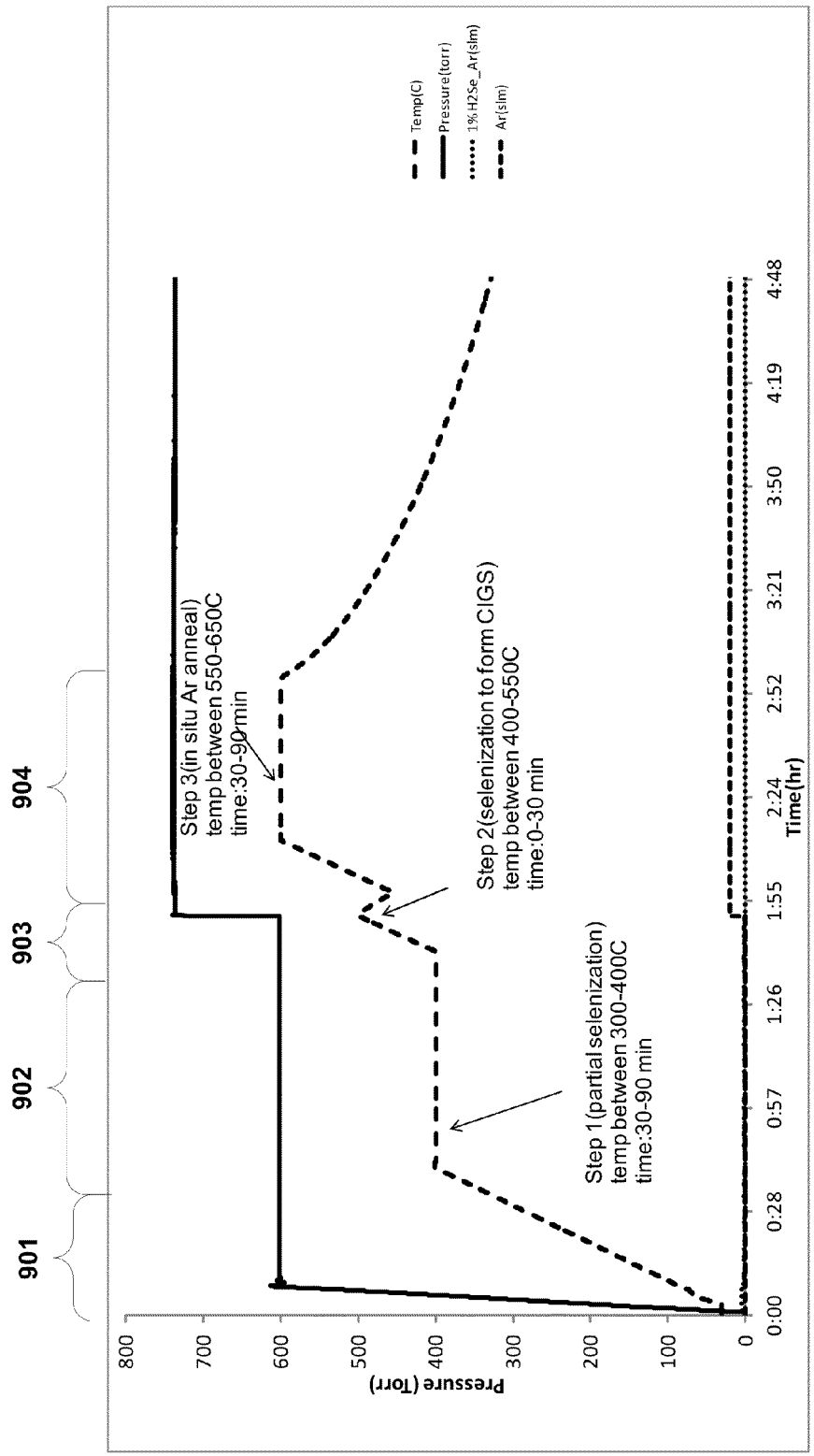
FIG. 9 illustrates a diagram depicting the temperature, gas flows, and chamber pressure during a selenization process according to some embodiments.

An alternate furnace profile is illustrated in FIG. 9. As discussed previously, a fast gas exchange step is introduced to replace $H_2Se$ in the furnace with an inert gas such as Ar, $N_2$, etc. to control the selenization. A detailed discussion of this furnace profile is described in co-owned U.S. patent application Ser. No. 13/563,448 entitled "Method of Chalcogenization to Form high Quality CIGS for Solar Cell Applications" which is herein incorporated by reference for all purposes.

FIG. 9 illustrates a diagram depicting the temperature, gas flows, and chamber pressure during a selenization process according to some embodiments of the present invention. The Cu—In—Ga metal precursor film may be a blanket film covering the entire substrate or may comprise a plurality of site isolated regions wherein the composition of the Cu—In—Ga metal precursor film has been varied in a combinatorial manner as discussed previously. The uniformity of the selenization process is largely determined by the temperature uniformity within the furnace. If the precursor film is exposed to a source of Se during these periods, the selenization of the film would be non-uniform and the device performance would be poor. This non-uniformity may be addressed by eliminating the exposure to a source of Se during these periods. However, in the absence of an exposure to a source of Se, indium will diffuse and agglomerate at temperatures above about 350 C. In some embodiments, the precursor film is exposed to an inert gas flow (i.e. Ar) with a small amount of $H_2Se$ during the initial temperature ramp steps, denoted by time period 901 in FIG. 9. As an example, the flow of a molar 1% $H_2Se$ in Ar gas may be held at about 1 standard liter per minute (slpm) during the initial temperature ramp. This provides enough Se to prevent the agglomeration of In, but does not provide enough Se to promote non-uniform selenization due to the temperature non-uniformity. A pressure of less than 1 atmosphere has been illustrated in FIG. 9. This pressure is selected as a safety precaution due to the toxic nature of $H_2Se$. The target temperature range for time period 901 is between about 300C and about 400C. As discussed previously, those skilled in the art will understand that parameters such as flow rates, gas composition, ramp rates, and temperature uniformity within processing equipment depend on the details of the equipment and that exemplary values used in the discussion to follow are not limiting.

Once the temperature has stabilized, the metal precursor film is held at this temperature and exposed to a dilute source of Se (e.g. $H_2Se$, diethylselenide (DESe), Se vapor, etc.). In this case, the source of Se is $H_2Se$, denoted by time period 902 in FIG. 9. An exemplary concentration of the $H_2Se$ is about 1 molar % $H_2Se$ in Ar. The concentration of Se is low so that the selenization process is slow and uniform. The temperature uniformity within the furnace is acceptable during this step and the partial selenization process will also be uniform.

As illustrated in FIG. 9, the furnace is then ramped to an intermediate temperature of between about 400C and about 550C, denoted by time period 903 in FIG. 9. As before, during this time, the CIGS film is exposed to a dilute source of Se. The furnace is filled with an inert gas (i.e. Ar) and the pressure within the furnace is increased to between about 1 atmosphere and about 2 atmospheres during temperature ramp steps. A pressure of 1 atmosphere has been illustrated in FIG. 9. This step completes the selenization of the metal precursor film. The increased temperature serves to increase the kinetics of the selenization reaction and the metal precursor film is fully converted.

As illustrated in FIG. 9, the furnace is then ramped to a final temperature of between about 550 C and about 650 C to anneal the film, denoted by time period 904 in FIG. 9. During this time period, the CIGS film is not exposed to a source of Se. The furnace is filled with an inert gas (i.e. Ar) and the pressure within the furnace is increased to between about 1 atmosphere and about 2 atmospheres during temperature ramp steps. A pressure of 1 atmosphere has been illustrated in FIG. 9. The purpose of this anneal step is mainly to allow the indium and gallium to interdiffuse within the film.

In each of the multi-step methods described herein, the performance of the absorber layer can be improved by incorporating a small amount (i.e. about 0.1 atomic %) of Na prior, during, or after the growth of the absorber layer. The incorporation of Na results in improved film morphology, higher conductivity, and beneficial changes in the defect distribution within the absorber material. The Na may be introduced in a number of ways. The Na may diffuse out of the glass substrate, out of a layer disposed between the glass substrate and the back contact (e.g. a Na containing sol-gel layer formed under the back contact), or out of the back contact (e.g. molybdenum doped with a Na salt). The Na may be introduced from a separate Na containing layer formed on top of the back contact. The Na may be introduced by incorporating a Na source in the Cu(In, Ga) precursor film. Examples of suitable Na sources comprise $Na_2Se$, $Na_2O_2$, $NaF$, $Na_2S$, etc. The Na may be introduced from a separate Na containing layer formed on top of the Cu(In, Ga) precursor film. The Na may be introduced from a separate Na containing layer formed on top of the partially or completely chalcogenized CIGS film. The Na may be introduced by incorporating a Na source in the Ga-rich film. The Na may be introduced from a separate Na containing layer formed on top of the Ga-rich film. The Na may be introduced after the final selenization step, followed by a heat treatment. The Na may be introduced by combining any of these methods as required to improve the performance of the absorber layer. It should be noted that similar Group IA, and/or Group IIA elements like K, and Ca might be used instead of sodium.

Figure 10:
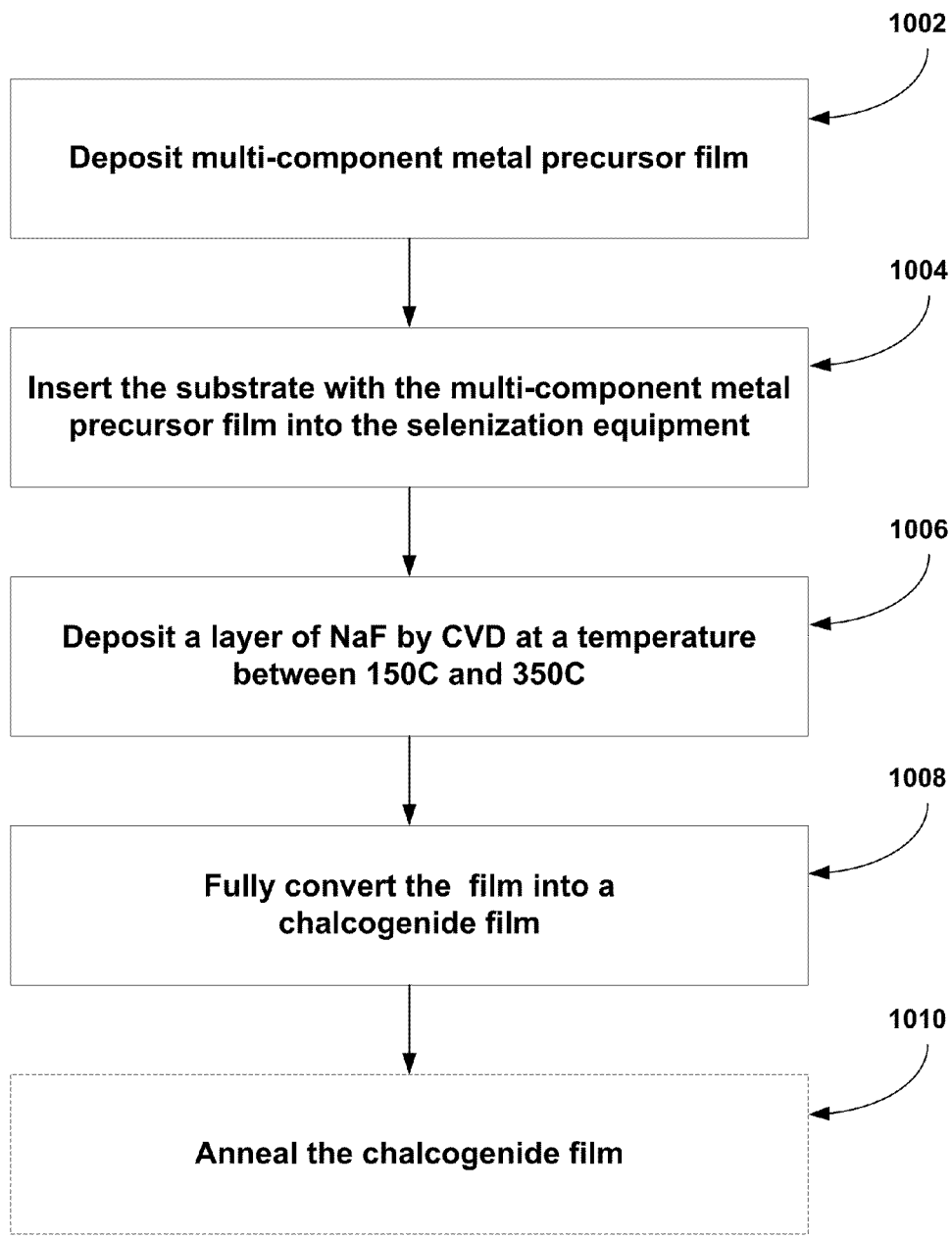
FIG. 10 illustrates a flow chart according to some embodiments.

In some embodiments, the Na may be introduced as a NaF layer formed using a CVD technique in the selenization equipment. FIG. 10 provides a flow chart that describes methods associated with these embodiments. In step 1002, a multi-component metal precursor film (e.g. Cu, In, Ga) is deposited on a substrate as discussed previously. As discussed previously, the metal precursor film may also include Ag. As discussed previously, a portion of the metal precursor film may be partially chalcogenized.

In step 1004, the substrate and the multi-component metal precursor film are inserted into the selenization equipment. Examples of suitable selenization equipment include the batch furnaces discussed previously with respect to FIGS. 8 and 9, in-line systems, or RTP systems.

In step 1006, a NaF layer is deposited on the surface of the multi-component metal precursor film before the first step (e.g. 801 and 901) of the chalcogenization process (i.e. selenization). The batch furnace configuration is well suited for the deposition of the NaF layer using CVD techniques. The NaF layer can be deposited at temperatures between about 150 C and 350 C. The NaF layer can be deposited at pressures between about 0.1 torr and 800 Torr. Alternatively, the NaF layer can be deposited in an in-line CVD system. Alternatively, the NaF layer can be deposited in an RTP system. Examples of precursors that are suitable for the deposition of the NaF layer using CVD include sodium hexafluoro-iso-propoxide, sodium perfluoro-t-butoxide, sodium hexafluoro-acetylacetonate, and sodium heptafluoro-octadionate. The thickness of the NaF layer is typically between 5 nm and 100 nm.

In step 1008, the entire precursor stack to form the final absorber is converted using a chalcogenization process. The chalcogenization process may include an additional anneal step at the end to improve the device performance as illustrated in step 1010.

Figure 11:
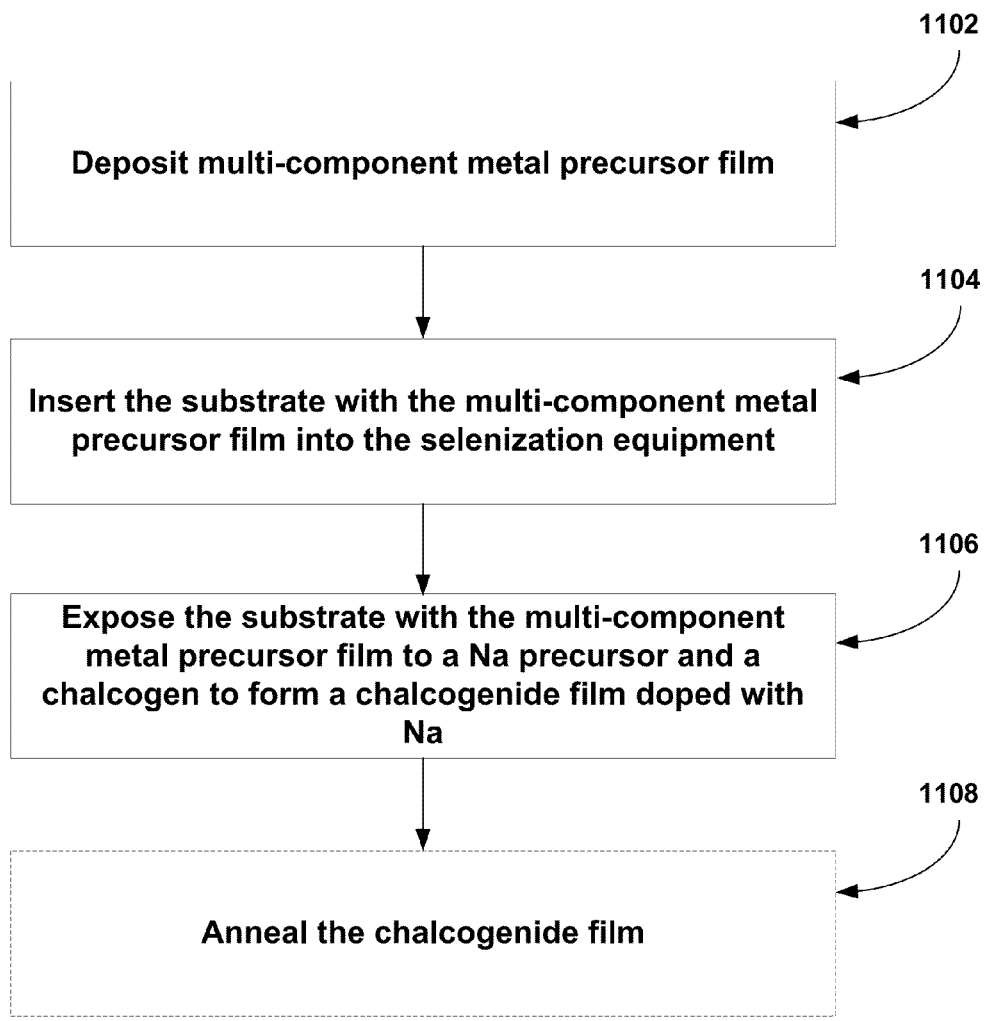
FIG. 11 illustrates a flow chart according to some embodiments.

In some embodiments, the Na may be introduced using a Na CVD precursor in the selenization equipment. FIG. 11 provides a flow chart that describes methods associated with these embodiments. In step 1102, a multi-component metal precursor film (e.g. Cu, In, Ga) is deposited on a substrate as discussed previously. As discussed previously, the metal precursor film may also include Ag. As discussed previously, a portion of the metal precursor film may be partially chalcogenized.

In step 1104, the substrate and the multi-component metal precursor film are inserted into the selenization equipment. Examples of suitable selenization equipment include the batch furnaces discussed previously with respect to FIGS. 8 and 9, or in-line systems.

In step 1106, a Na precursor is introduced during the chalcogen exposure steps as discussed previously (e.g. 802 and 902) of the chalcogenization process (i.e. selenization). The batch furnace configuration is well suited for the use of Na precursors. The Na precursor exposure can occur at temperatures between about 150 C and 350 C. The Na precursor exposure can occur at pressures between about 0.1 torr and 800 Torr. Alternatively, the Na precursor exposure can occur in an in-line CVD system. Examples of Na precursors that are suitable for the exposure include sodium hexafluoro-iso-propoxide, sodium perfluoro-t-butoxide, sodium hexafluoro-acetylacetonate, and sodium heptafluoro-octadionate. During step 1106, the entire film is also converted to a chalcogenide. The chalcogenization process may include an additional anneal step at the end to improve the device performance as illustrated in step 1108.

The deposition of the NaF layer in the selenization equipment allows the concentration and uniformity of the Na to be tightly controlled. Additionally, the deposition of the NaF layer in the selenization equipment eliminates the need for the dedicated equipment typically used to introduce the Na. Examples of equipment that may be eliminated include e-beam or thermal evaporators, sol-gel coating and curing systems, specialized metal sputtering targets that incorporate Na salts, etc. Overall, this reduces the complexity and the cost associated with the manufacture of the TFPV devices. An illustrative example of the benefits of Na on the efficiency of CIGS absorbers is discussed below. The NaF layers in the example were formed by e-beam evaporation. However, the NaF layer could also be deposited using the CVD techniques discussed previously.

Illustrative Examples-Cited References are Listed at the End

These examples discuss a sodium fluoride (NaF) thickness variation study for the $H_2Se$ batch furnace selenization of sputtered Cu(In, Ga) films in a wide range of Cu(In, Ga) film compositions to form CIGSe films and solar cells. Literature review indicates a lack of consensus on the mechanisms involved in Na altering CIGSe film properties. In this work, for sputtered and batch-selenized CIGSe, NaF addition results in reduced gallium content and an increase in grain size for the top portion of the CIGSe film, as observed by scanning electron microscopy, secondary ion mass spectrometry, and extraction of the band gap from external quantum efficiency and photoluminescence data. The addition of up to 20 nm of NaF resulted in improvement in all relevant device parameters: efficiency, open-circuit voltage, short-circuit current, and fill factor. The best results were found for 15 nm NaF addition, resulting in solar cells with 16.0% active-area efficiency (without anti-reflective coating) at open-circuit voltage ($V_{OC}$) of 674 mV.

Introduction $Cu(In, Ga)Se_2$ (CIGSe or CIGS) has proven to be a prime candidate for high-efficiency thin-film photovoltaics (TFPV) with laboratory champion efficiencies over 20% [1, 2], and panels from manufacturing lines producing champions in the range of 13-15%. During the past decade, global accumulated nameplate manufacturing capacity of CIGSe-based solar cells has reached the 1-2 GW range.

CIGSe films have been grown over the past decades by a number of different vacuum deposition techniques including co-evaporation [3, 4], selenization and sulfurization of sputtered Cu(In, Ga) [5], reactive sputtering of metallic targets [6], (non-) reactive sputtering of chalcogenide targets [7], and various non-vacuum techniques [8]. Most CIGS TFPV manufacturing capacity today relies on batch furnace selenization and sulfurization with hydride gases ($H_2Se/H_2S$) of sputtered Cu(In, Ga). During the remainder of this discussion CIGSe will be used as a label to describe all common alloys, like CIGSe, CIGSSe, CISe, and CISSe.

It is well known that the control of sodium (Na) during the growth of the CIGSe absorber layer is crucial to achieve high efficiency [4, 9, 10]. Several extensive reviews on the influence of Na exist [11-15] mainly dealing with co-evaporated CIGSe.

The growth path to the final CIGSe film can vary tremendously between the "bottom-up" co-evaporation and "top-down" selenization of metallic Cu(In, Ga), or even within the same growth method for varying processing conditions. This makes it challenging to transfer learning from co-evaporated CIGSe to CIGSe grown by batch selenization. While sputtered Cu(In, Ga) followed by $H_2Se/H_2S$ batch-selenization is the most common CIGSe technology on the manufacturing floor today, there are far fewer reports on the effects of Na in such films compared to the number of studies reported for co-evaporation. In addition, it is still unclear how to best select the optimal Na location and source, especially when trying to introduce Na uniformly over large areas.

This discussion presents a detailed CIGSe film and solar cell investigation for sputtered Cu(In, Ga) followed by $H_2Se$ batch selenization with active Na addition for varying NaF thicknesses, in a broad range of Cu/(In+Ga) [CGI], Ga/(In+Ga) [GGI], and Cu(In,Ga) thicknesses enabled by a combinatorial high-throughput method. Both CIGSe film and related device properties are characterized, and results are compared with previous work. We find that NaF addition results in reduced gallium content and an increase in grain size for the top portion of the CIGSe film, and an improvement in all relevant device parameters.

Sodium Influence on CIGS Films and Solar Cells

So far, 20% efficiencies have only been reported by relying on Na diffusion from soda lime glass (SLG, or standard "float glass") during co-evaporation of CIGSe at processing temperatures reaching 550-600° C. [1, 2, 16]. Efficiencies up to 18.7% on plastic [18] have been reported with adding NaF.

Na has been reported to alter many film and device properties for co-evaporated CIGSe. It slows down the indium-gallium inter-diffusion during 3-stage co-evaporation [19-22], slows down inter-diffusion in a stack of CGSe/CISe as explained by a reduced number of vacancies in the presence of Na [23], and slows down Cu in-diffusion at low temperatures (<450° C.) [24]. Rockett observed that Na reduces the diffusivity of Ga out of GaAs into CI(G)Se [15].

Na has been reported to alter crystal orientation for (2- and 3-stage) co-evaporation by inducing the (112) orientation over the (220, 204) orientation when present during CIGSe growth, albeit dependent on the combination of Na addition and CIGSe growth methods [17, 19]. NREL's champion cells exhibit a preferred crystal orientation of (220, 204) not (112) [1].

The grain size of co-evaporated CIGSe has been reported as being unaffected by Na for grain sizes up to 500 nm [30], but also to both increase from below 0.5 μm up to 1.0 μm size for 2-stage co-evaporated CIGSe [17], and decrease for 3-stage co-evaporated CIGSe from 1-2 μm down to below 0.5 μm upon the addition of Na [19, 21, 22, 31]. The increase in grain size for 2-stage co-evaporated CIGSe by Na implies an alteration in nucleation or enhanced atomic diffusivity, especially on grain surfaces where growth occurs [15].

The selenization of the Mo electrode is enhanced by the presence of Na [22, 46], where sodium selenide compounds might play a role in this process [47].

The co-evaporated CIGSe TFPV devices grown in the presence of Na most commonly show higher efficiencies, due to higher open-circuit voltage ($V_{OC}$), and higher fill factor (FF) [11-15]. The increase in $V_{OC}$ (and FF) is believed to be caused by increased net carrier concentration, typically one order of magnitude [20, 31] due to either an increased p-type doping concentration with a shorter resulting Space Charge Region (SCR), potentially by a reduction of compensating donors, and/or reduced recombination.

There are far fewer reports on the effects of Na in sputtered Cu(In, Ga) films followed by $H_2Se/H_2S$ batch selenization compared to the number of studies reported for co-evaporation. Wieting et al. showed the importance of separate Na addition for sputtered Cu(In, Ga) followed by $H_2Se/H_2S$ batch conversion [55]. A steady increase of efficiency with Na dosing was observed as a result of an increase in all three main parameters ($V_{OC}$, $J_{SC}$, and FF), accompanied by an improvement in visual uniformity.

A technology related to the hours-long $H_2Se/H_2S$ batch selenization is the deposition of elemental selenium on top of Cu(In, Ga) followed by rapid thermal processing (RTP), typically for less than 15 min. Probst et al. describe an increase in efficiency from 5-6% to 9-13% accompanied by an increase in grain size for RTP-grown CIGSe when evaporating sodium selenide between the Mo and the Cu(In, Ga) [56]. The separate Na addition for RTP-grown CIGSe allows for improved uniformity—as observed in optical beam induced current (OBIC) mapping and reproducibility—and hence higher efficiencies [57], the latter at least partially due to an increase in the free carrier concentration [58].

Na is shown to alter the intermediate phase formation and consumption for RTP-grown CIGSe, and therefore affects the final grain-size distribution, homogeneity, and compositional depth profile of the desired quarternary Cu(In, Ga)Se$_2$ film in a negative way [59, 60]. This negative effect of Na is anticipated to hold mainly for solid-state reactions based on (non-redox reaction) inter-diffusion. These considerations are supported by the effective heat of formation model in which Na is present as sodium polyselenides at the crystallite surfaces [51].

Determining what mechanisms allow Na to have such a huge influence on the CIGSe growth, and CIGSe thin film device properties is of interest. Various studies propose that Na acts at the growing surface [15, 47, 51]. The primary effect of Na is proposed to be the organization of the point defects during growth, thereby providing an improved crystal structure. The related increase in net hole densities has been proposed to arise mainly from a reduction of compensating $In_{Cu}$ anti-site donors [13, 42, 52]. In addition, first-principles calculations show that Na suppresses the ordered defect compound formation [13]. The action of Na at the growing surface has been proposed to occur via sodium selenides acting as a desirable Se-reservoir [47], or negatively influence the thermodynamics and kinetics of RTP-grown CIGSe [51]. Furthermore, the presence of Na might result in a redistribution of oxygen in the CIGSe film [13, 37].

Kronik et al. have proposed a grain boundary passivation model to explain the increase in hole density: Na catalyzes the oxygenation of dangling In bonds in the grain boundaries resulting in a reduction of compensating donors [14, 53]. Rudmann et al. hypothesize that Na passivates the donors at grain boundaries more than it alters CIGSe growth kinetics, derived from the positive effect of a post-deposition treatment with NaF for 3-stage co-evaporated CIGSe grown at low temperatures (<450° C.) [31]. A similar (though higher temperature) post treatment on epitaxial CIGSe showed a similar beneficial reduction in compensating donor density [15, 42].

In summary, Na has been observed to alter both the path (kinetics) towards and the preferred final state (thermodynamics) of the CIGSe film, in addition to the sensitivity of the CIGSe film to the atmosphere. Furthermore, the partial conversion of the Mo film underneath the CIGSe film is altered by the presence of Na as well. The most striking is the observation of both positive and negative effects on CIGSe film formation.

EXPERIMENTAL

The Mo-coated soda lime glass substrates were purchased from a commercial vendor (Guardian Industries). The substrates were cut into 13.0 cm by 6.5 cm rectangles and cleaned with detergent solution, then blown dry with $N_2$ prior to precursor deposition. For experiments with controlled NaF addition we used substrates with an alkali diffusion barrier ($SiO_xN_y$), otherwise substrates without $SiO_xN_y$ were used.

The Cu(In, Ga) precursors were deposited in an Intermolecular Tempus™ P-30 High Productivity Combinatorial (HPC™) sputtering tool that allows for the simultaneous use of 4 different targets for co- and/or sequential-sputtering of Cu, In, and Ga with systematically controlled lateral gradients in composition and thickness within one substrate. The ranges of film thickness and composition could be accurately controlled by PVD modeling. The film thickness range was 450-600 nm with composition range of Cu/(In+Ga)=0.8-1.0, and Ga/(Ga+In)=0.30-0.45. Plates were stored after Cu(In, Ga) deposition in a $N_2$-containing glovebox for several days prior to selenization. NaF is deposited by electron beam evaporation, either on the Mo back contact, or on top of the Cu(In, Ga) prior to selenization. As discussed previously, the NaF could have been deposited using a CVD technique in the selenization equipment. The NaF thickness was varied from 10 to 30 nm. Selenization of the Cu(In, Ga) metal precursors with $H_2Se$/Ar was performed in a commercial quartz furnace customized for safety. The selenization process includes two soak steps in $H_2Se$ at 250° C. followed by 500° C., finalized with an in-situ Ar annealing at 600° C.

The complete solar cells included a buffer layer of ~50 nm CdS deposited by chemical bath deposition (CBD) in a beaker, followed by a double layer (high resistivity/low resistivity) of (pulsed) DC sputtered ZnO:Al in a commercial PVD sputtering tool. The thickness of the i-ZnO and ZnO:Al layers were about 50 nm and 500 nm, respectively. The resistivity of the ZnO:Al film was $1.4 \times 10^{-3}$ Ωcm. Ni/Al front contacts were deposited in an electron beam evaporator through a shadow mask.

The thickness of the Ni and Al layers were 50 nm and 3 μm, respectively. Back contact was formed by In soldering on exposed Mo after mechanical removal of the top layers. No anti-reflection coatings were used. The finished cells were about 0.5 cm by 1.0 cm and all cell parameters are reported for a nominal active-area of 0.44 $cm^2$. Precise cell area and grid shadow area were determined by image analysis of the champion cells using a high resolution camera. No devices were made with 30 nm NaF due to peeling during CdS deposition.

The structure of the CIGSe absorber was investigated by X-ray diffraction (XRD) with Cu $K_a$ radiation. Surface morphology and grain size were observed by scanning electron microscopy (SEM). At least 5 images at different locations per sample for a select group of samples were made to ensure statistical significance of the images shown. The composition was determined by X-ray fluorescence (XRF). All CGI, GGI, and Cu(In,Ga) thickness values are calculated based on XRF after Cu(In, Ga) deposition. Se percentage values are calculated based on XRF after selenization. Compositional depth profile was determined by Secondary Ion Mass Spectrometry (SIMS) using $Cs^+$ primary beam in positive detection mode. Optoelectronic quality and surface band gap was investigated by spectrally resolved room temperature photoluminescence (PL), using a 660 nm solid state laser with a spot size ~1 mm in diameter. The presented SIMS and XRF measurements are performed on bare CIGSe witness films. Numerous other samples were measured (not shown) after etching the full solar cell down to CIGSe. SEM and XRD measurements were performed on CIGSe films after removing the CdS, TCO, and grid using an acidic solution. SIMS, XRD, and SEM was performed at a similar location on the 13.0 cm by 6.5 cm rectangles with CGI=0.85, and GGI=0.35. PL was performed on full cells.

Current-Voltage (J-V) measurements were performed in a Newport Oriel Solar Simulator automated by Intermolecular for fast J-V measurements on multiple cells. Test condition was simulated air mass 1.5 global (AM1.5G, 100 mW/$cm^2$) at room temperature. The J-V parameters were extracted using an analytical method [62]. The inverse of the slope at $J_{sc}$ was used for the shunt resistance. QE was measured on an Oriel model IQE-200 with a 1 mm×2.5 mm rectangular spot size from a quartz tungsten halogen lamp and monochromator with chopper running at 30 Hz. The External Quantum Efficiency (EQE) metrology system was automated by Intermolecular for fast measurements on multiple cells. Capacitance-Voltage (C-V) measurements were performed on Agilent model B1500 to measure the carrier density. The C-V measurements were performed at a similar location on the 13.0 cm by 6.5 cm rectangles with CGI=0.85, and GGI=0.35.

Each 13.0 cm by 6.5 cm rectangle hosts 110 unique solar cells due to the systematic lateral variation in the Cu(In,Ga) film. The results below are a selection of the more than 6,000 unique solar cells made during this study to ensure statistical significance of the results.

Results and Discussion

Variation in the CIGSe Film Microstructure with Varying NaF Layer Thickness

Figure 12:
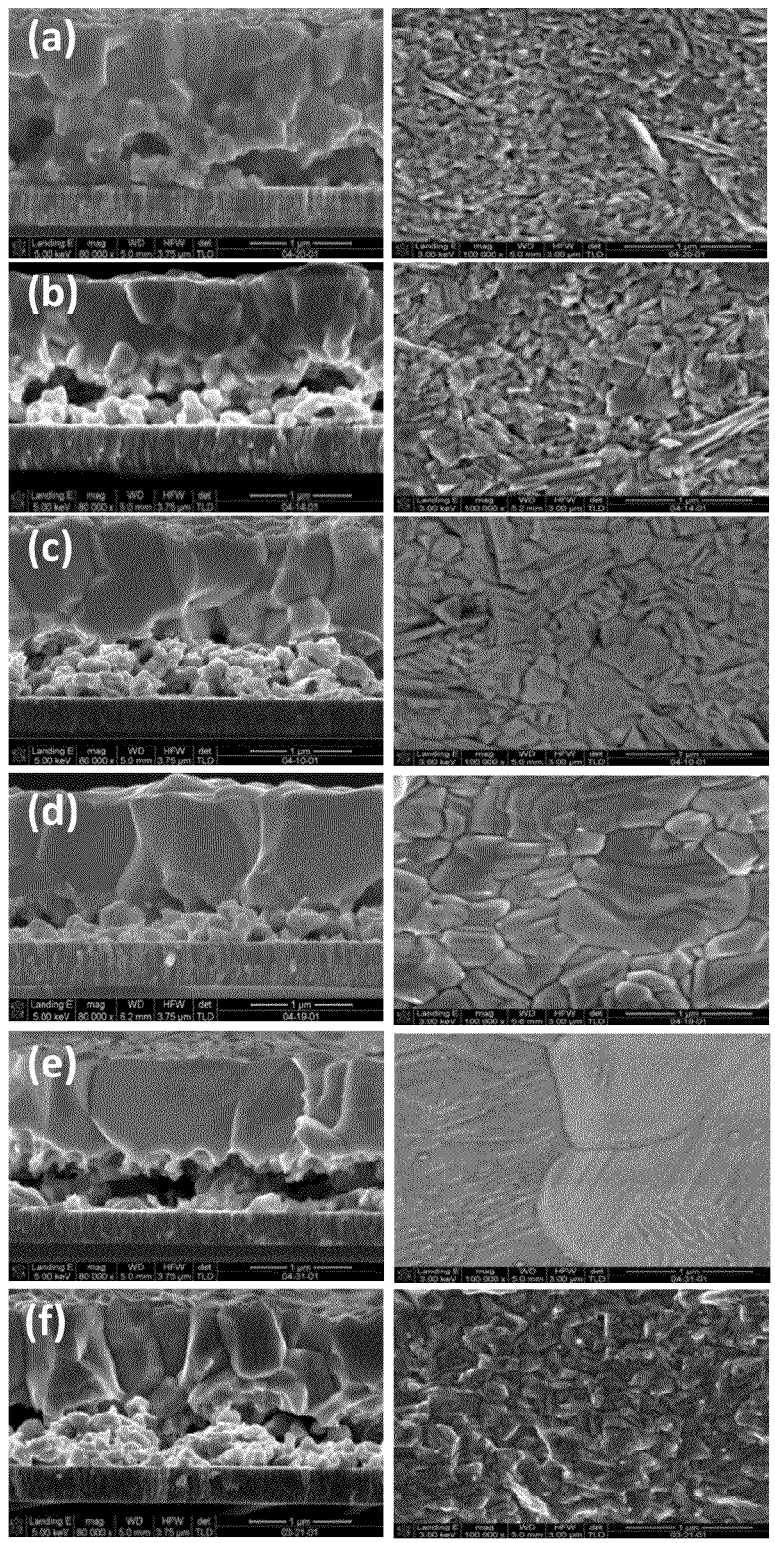
FIG. 12 present SEM micrographs of films formed according to some embodiments.

Cross-sectional and plan-view SEM imaging (see FIG. 12) is used to investigate the effects of Na on the microstructure of the CIGSe layer for NaF addition on top of Cu(In, Ga). The pair of images in FIG. 12(*a*) correspond to the case where there is no NaF layer; those in FIG. 12(*b*) the case where the NaF layer is 10 nm in thickness, those in FIG. 12(*c*) the case where the NaF layer is 15 nm in thickness, those in FIG. 12(*d*) the case where the NaF layer is 20 nm in thickness, and those in FIG. 12(*e*) the case where the NaF layer is 30 in thickness. For a NaF thickness from 0 nm through 10 nm, top-down SEM images show signs of potential (binary) impurity phases, whereas this is less observed for 15 nm and 20 nm, and not seen for 30 nm. A clear increase in grain size and reduced roughness can be observed with increasing NaF thickness. Furthermore, the grain size for the no-barrier CIGSe case shown in FIG. 12(*f*) most resembles the grain size of the 10 nm NaF thickness.

Cross-sectional SEM images show the formation of a CIGSe bi-layer for all Na conditions investigated. A bottom layer of small grains with voids is capped with a layer of large grains. The grain size of the top layer increases with increasing NaF thickness. No signs of excessive $MoSe_2$ formation can be found, however this does not exclude the formation of MoSe$_2$. The bi-layer formation has been observed previously for CIGSe grown in a H$_2$Se/H$_2$S batch furnace [63], though different grain-size distributions can be obtained as well [64, 65].

Similar to previous work on RTP-grown CIGSe [51, 56] and for 2-stage co-evaporated CIGSe [17], an increase in grain size is observed with an increase in Na though this is opposite to the grain size decrease observed for 3-stage co-evaporation [19, 21, 22, 31]. However, where a clear lateral bi-modal grain size distribution can be observed for RTP-grown CIGSe due to Na [51], this work only indicates a distinct bi-modal grain size distribution in depth for the H$_2$Se batch furnace selenization.

Variation in the CIGSe Film Phase Purity with Varying NaF Layer Thickness

Figure 13:
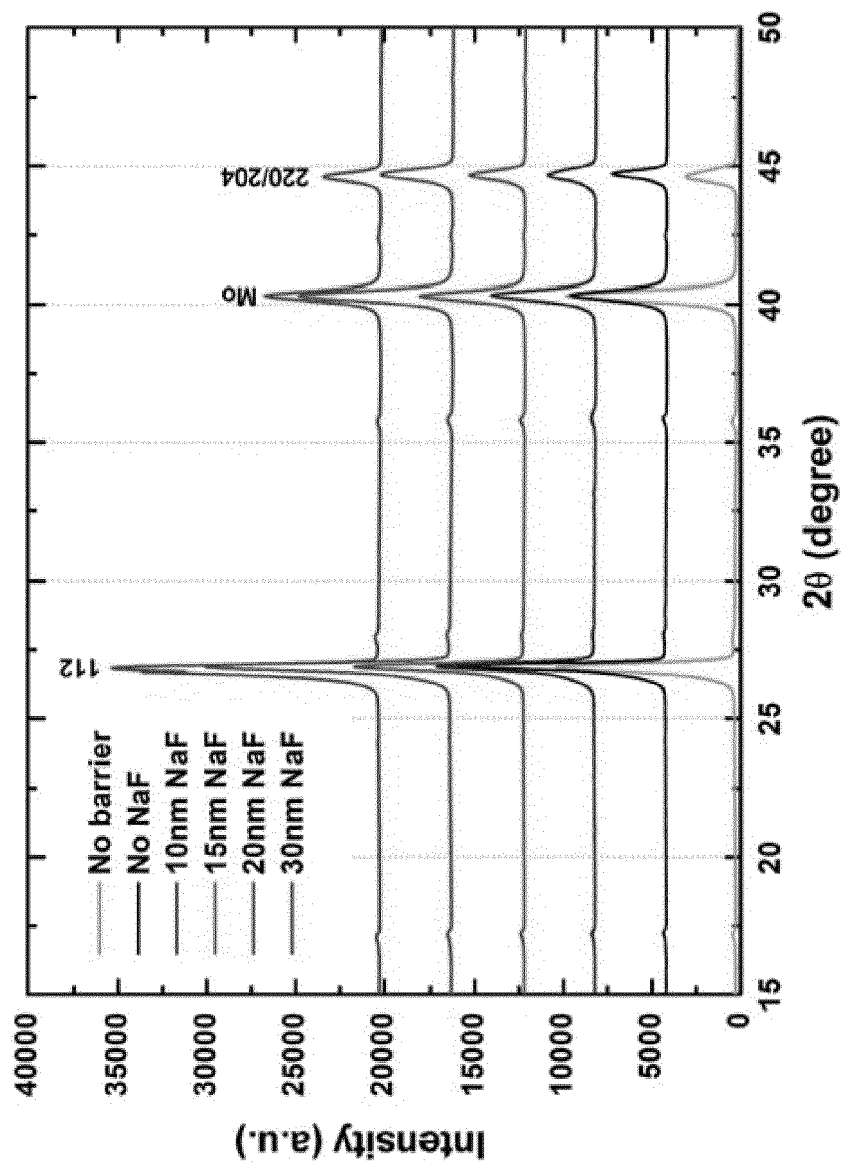
FIG. 13 presents x-ray diffraction data of films formed according to some embodiments.

FIG. 13 shows the XRD patterns of CIGSe films produced with different NaF thicknesses. For all Na conditions, an asymmetry in the CIGSe peaks with a shoulder to the left is observed. The left shoulder has been observed previously, both for 3-stage co-evaporated CIGSe [19], and RTP-grown CIGSe [51] and is an indication of lack of homogeneity in GGI. The peak width is the largest for 30 nm NaF (FWHM=0.43), and the narrowest for 0 nm NaF (FWHM=0.28). The diffraction intensity ratio of (112) peak to (220, 204) peak ranges from 3.0:1 (15 nm NaF) to 4.4:1 (30 nm NaF) with no clear trend in NaF thickness. All CIGSe films show a slight preferred orientation in the (112) direction compared to JCPDS powder standard of Cu(In$_{0.7}$Ga$_{0.3}$)Se$_2$ (ratio 2.5:1).

Figure 14:
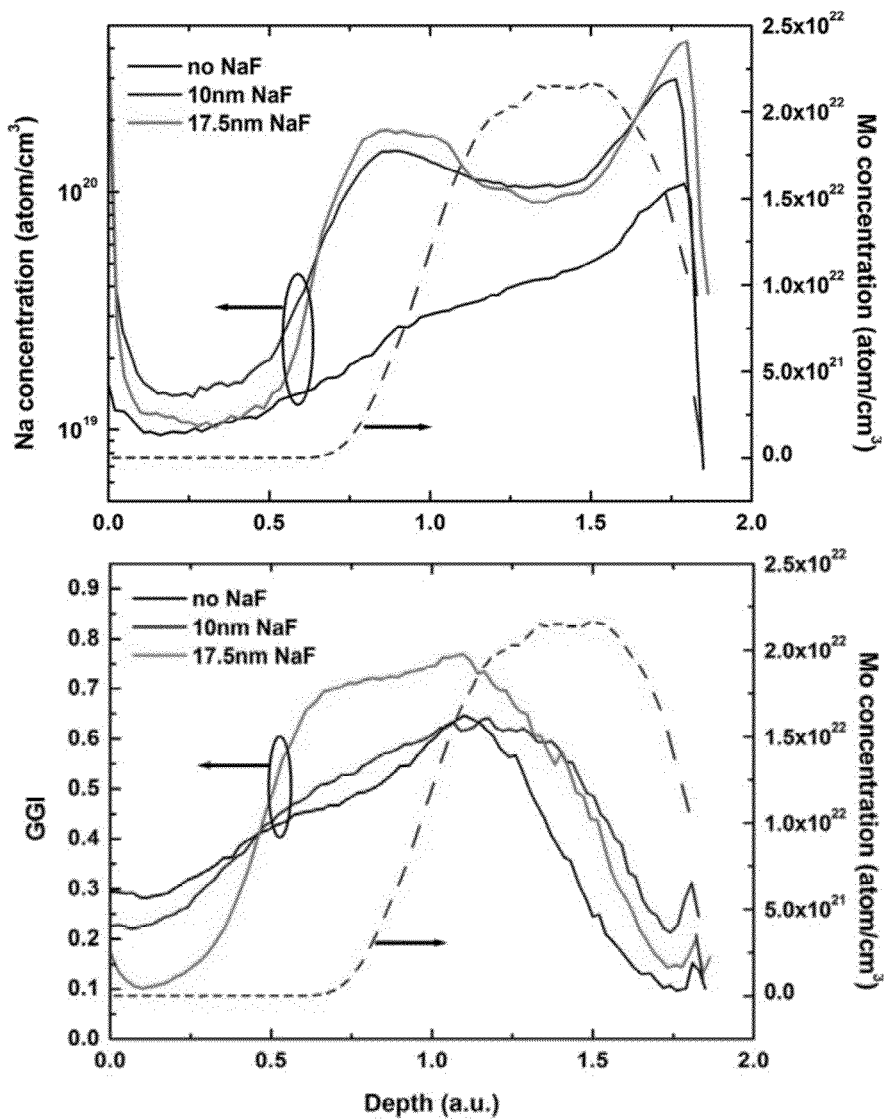
FIG. 14 presents SIMS data of films formed according to some embodiments.

Variation in the CIGSe Film Composition Depth Profile with Varying NaF Layer Thickness FIG. 14 shows the Na, Ga, In, and Mo concentration depth profiles in the CIGSe films as measured by SIMS. GGI was calculated based on the ratio of the secondary ion counts. A clear increase in Na levels in the CIGSe and Mo film can be observed for the CIGSe films grown with additional NaF compared to the CIGSe film grown on barrier-coated glass with 0 nm NaF. The Na concentration is the highest at the CIGSe surface and in the back of the CIGSe film near the Mo electrode, as commonly observed [12, 31, 38]. The grain boundary area in the top layer decreases with increasing NaF thickness, as can be observed in the corresponding cross-sectional SEM images in FIG. 12(a) through FIG. 12(e). This might explain the lower Na concentration in the top layer for 17.5 nm compared to 10 nm NaF. The high Na concentration in the bottom layer of the CIGSe film might be solely due to the large surface area of the small grains, though an increase in Na incorporation into the CIGSe grain interior with an increase in GGI cannot be ruled out. Similarly, the formation of new Na-containing compounds, like (Na, Cu)(In, Ga)Se, or Na(In, Ga)Se might contribute as well [26, 45]. The GGI depth profile shows a clear decrease in GGI homogeneity with increasing NaF thickness. The increase in GGI at the CIGSe surface creating a notch is believed to be an artifact of the SIMS measurement, since it is not consistently observed.

Similar to the decrease in GGI homogeneity upon the addition of Na for RTP-grown CIGSe films [51], co-evaporated CIGSe [19-23], and epitaxial CIGSe [15], these SIMS data show a decrease in GGI homogeneity when Na is used during H$_2$Se batch selenization. It has been previously observed that Na can also improve the GGI homogeneity in depth [66].

Na does not seem to influence the preferred crystal orientation for H$_2$Se batch selenization, in contrast to observations made for co-evaporation [17, 19]. The combined observations in SEM and SIMS suggest that the small grains in the bottom portion of the CIGSe film are high in GGI. A reduction in grain size with an increase in GGI is commonly observed for co-evaporation [25]. This could also explain the increase in grain size with an increase in NaF for the top layer, due to the concomitant reduction in GGI in the top layer.

Variation in the CIGSe Solar Cell Performance with Varying NaF Layer Thickness

Figure 15:
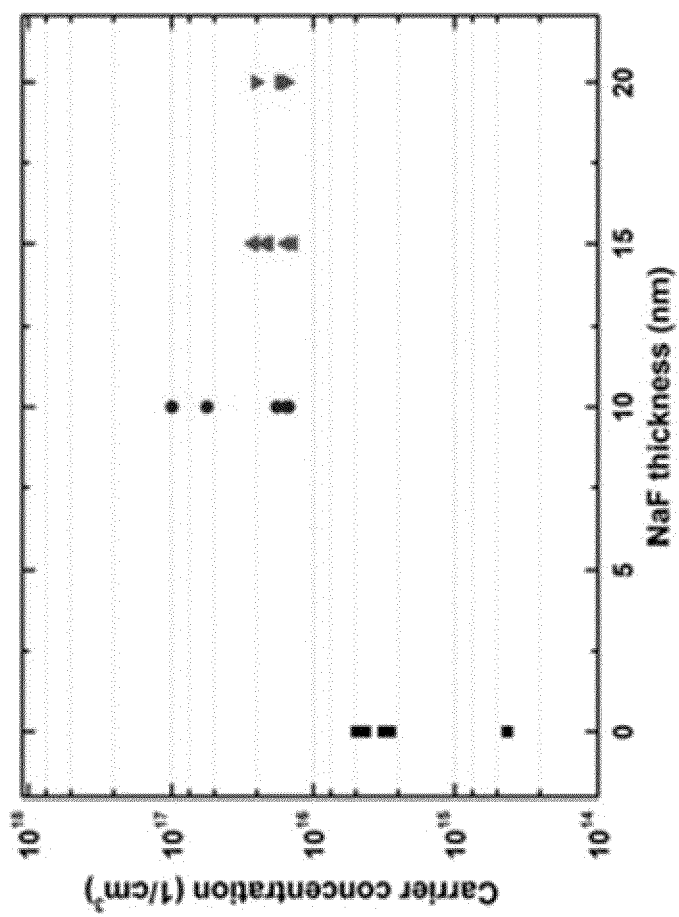
FIG. 15 presents carrier concentration versus NaF thickness data of films formed according to some embodiments.

Room temperature Capacitance-Voltage (C-V) measurements were taken at 100 kHz in the dark for varying NaF thicknesses. FIG. 15 shows the carrier concentration data as a function of NaF thickness for the selected cells. These measurements show an increase of one order-of-magnitude in majority carrier concentration when adding 10-20 nm NaF compared to 0 nm NaF. Similar observations have been made upon the addition of Na for both RTP-grown CIGSe [58] and co-evaporated CIGSe [20, 31].

Figure 16:
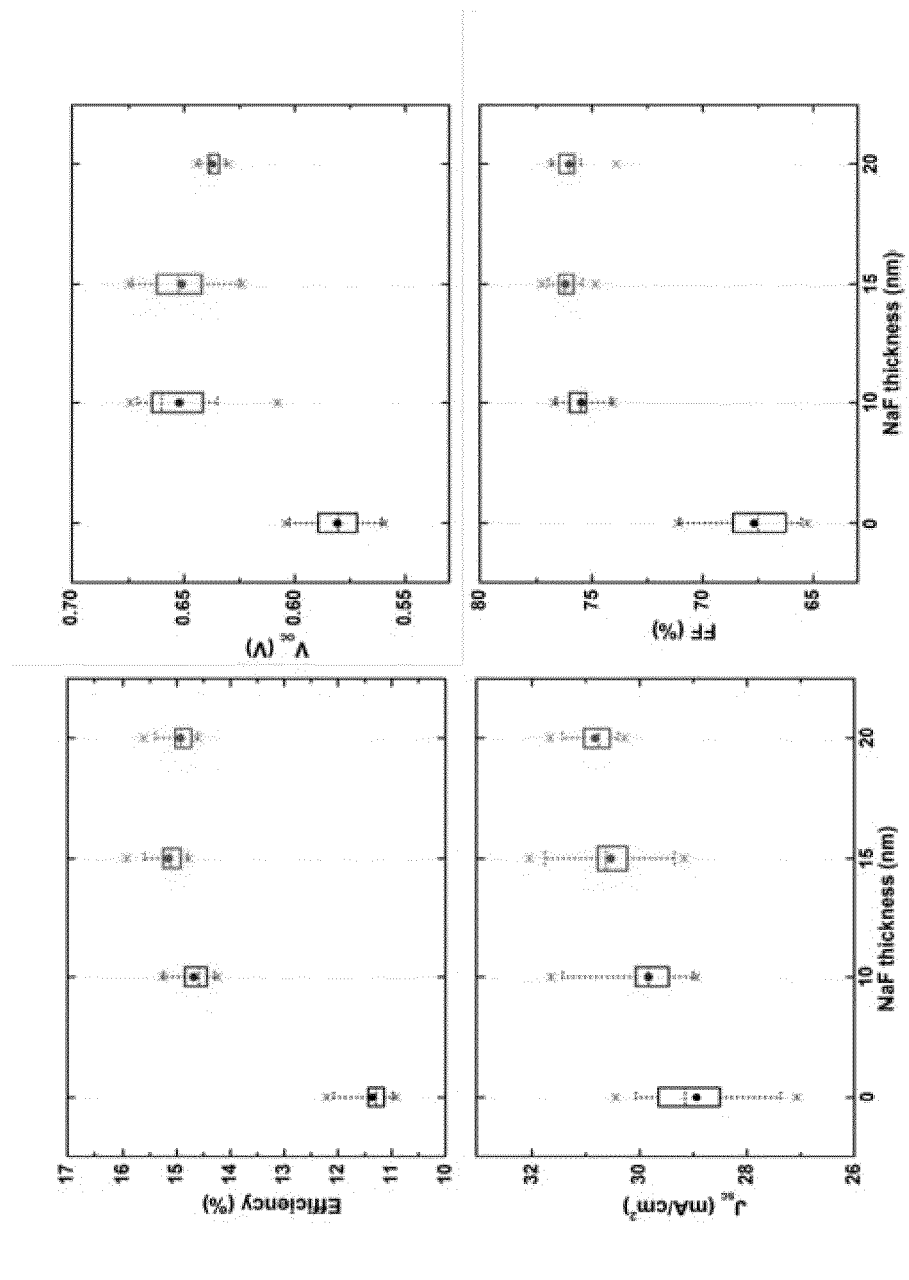
FIG. 16 presents device performance versus NaF thickness data of films formed according to some embodiments.

FIG. 16 summarizes the device performance data for the best 20 cells-per-plate selected for each NaF thickness. The next section of this discussion provides a detailed analysis of the device performance data for all cells related to these plates.

FIG. 16 shows a clear jump in all four parameters (efficiency, $V_{OC}$, $J_{SC}$, and FF) from 0 nm to 10 nm NaF. Due to a significant drop in $V_{OC}$ for 20 nm NaF, the efficiency peaks for 15 nm NaF. The changes in efficiency and FF with NaF addition most resemble the variation in carrier concentration from C-V measurements with NaF.

Figure 17A:
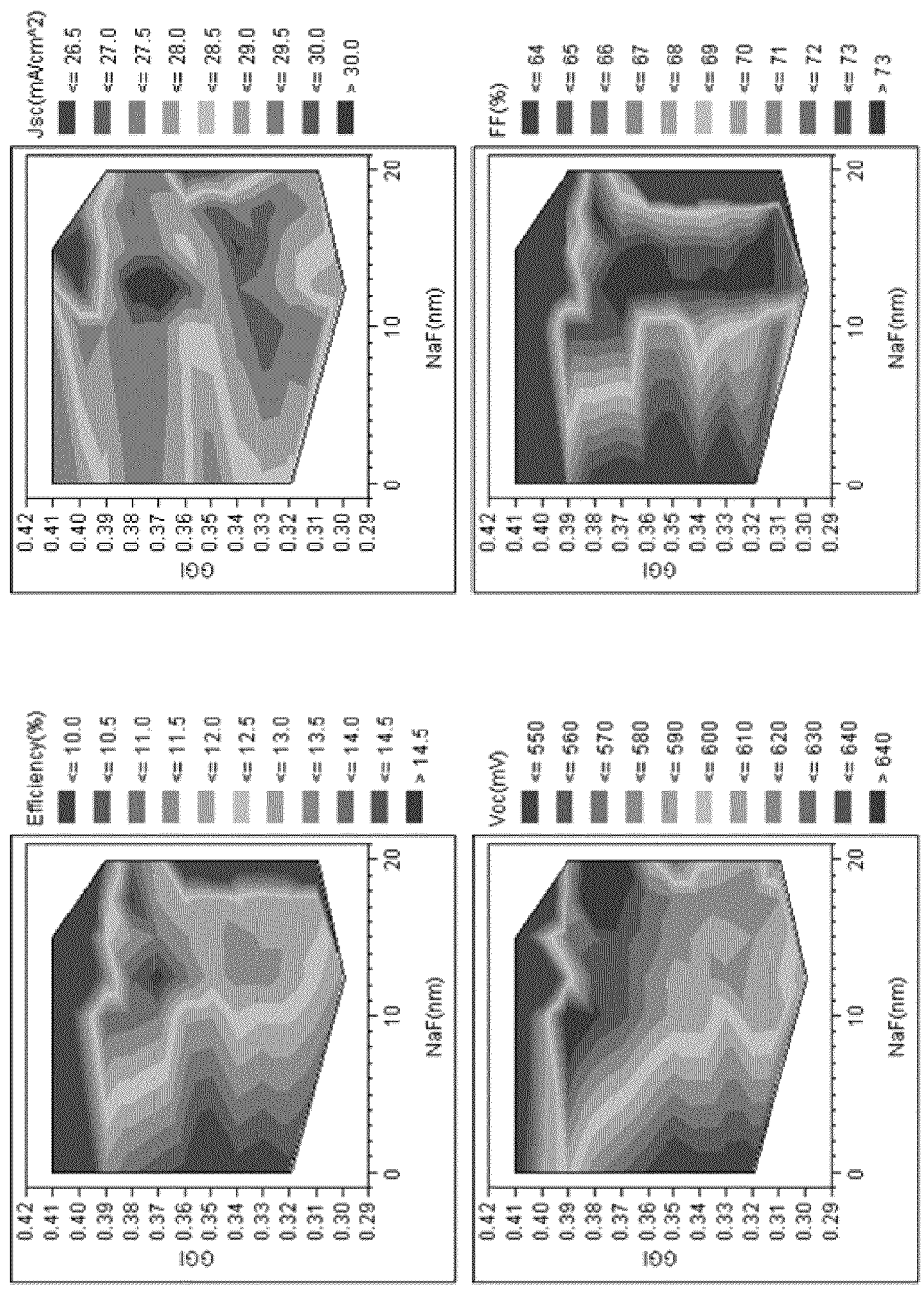
FIG. 17A presents device performance versus NaF thickness data of films formed according to some embodiments.
Figure 17B:
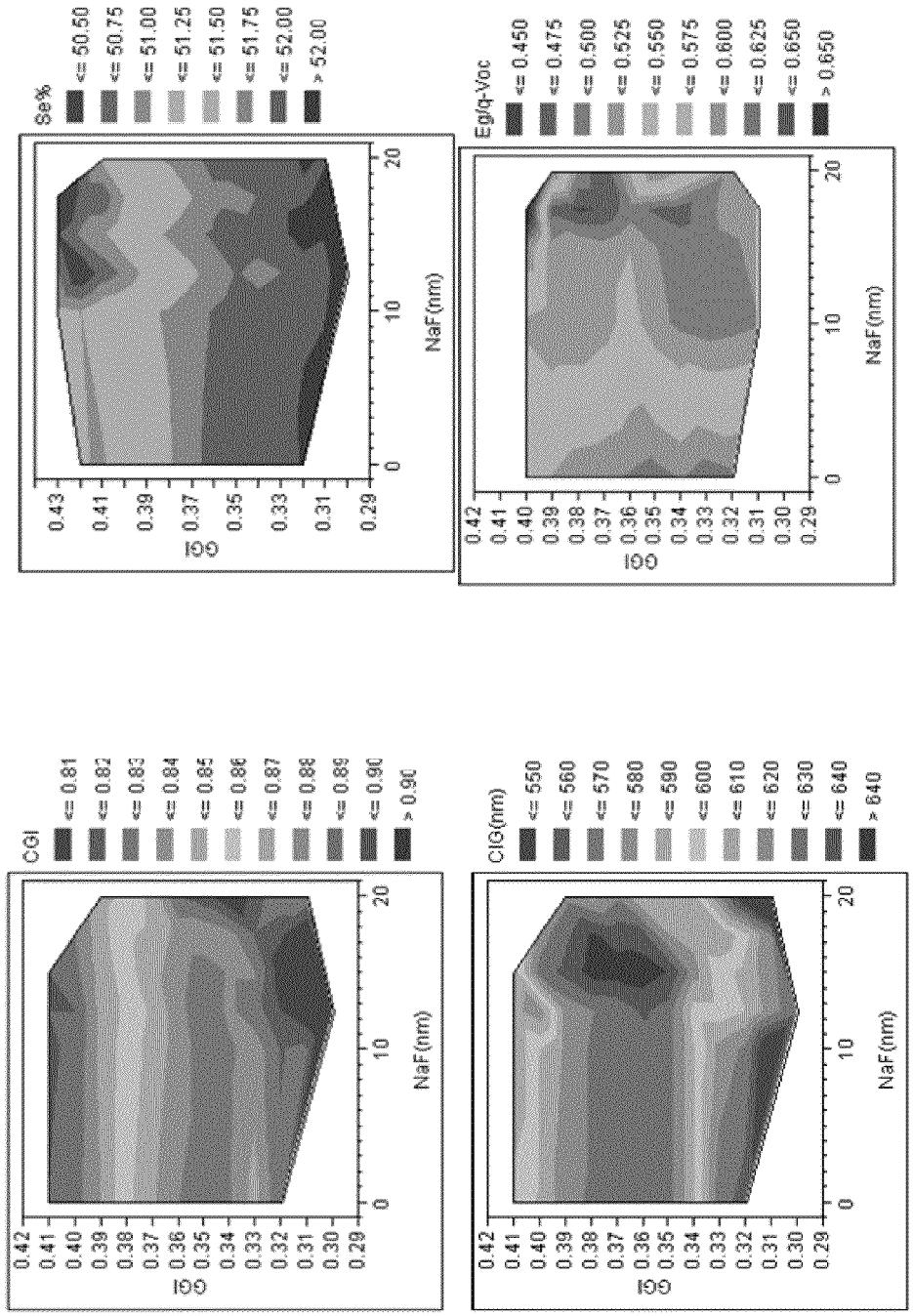
FIG. 17B presents device performance versus NaF thickness data of films formed according to some embodiments.
Figure 17C:
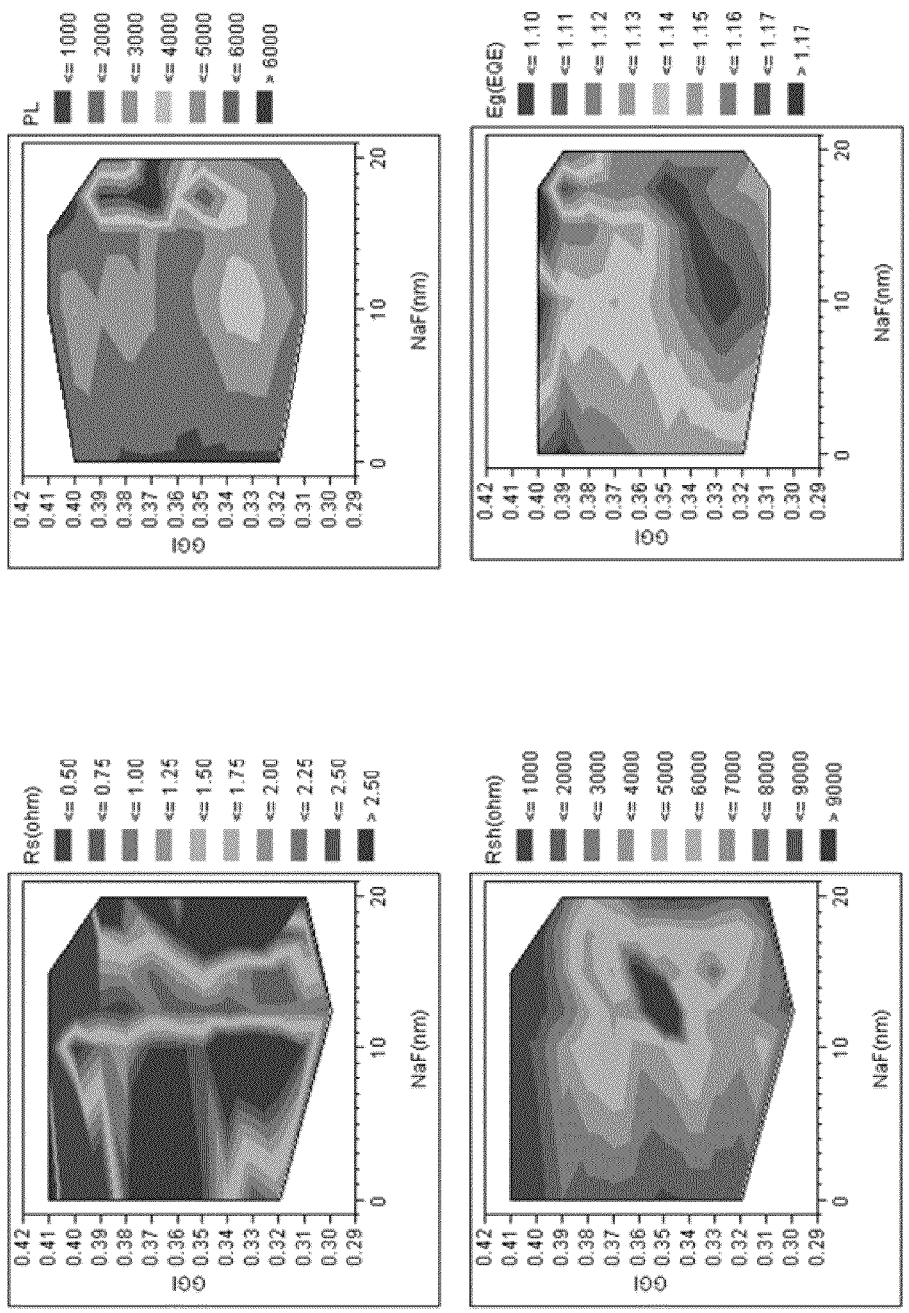
FIG. 17C presents device performance versus NaF thickness data of films formed according to some embodiments.

To get a better understanding of the interplay between Cu(In, Ga) film composition and NaF thickness, FIGS. 17A-17C shows contour maps of GGI (by XRF) and NaF on CIGSe film and device parameters. The maps are only populated for NaF thicknesses of 0, 10, 12.5, 15, 17.5, and 20 nm, while GGI varies continuously for the range shown.

Due to the target configuration there is a dependence of CGI on GGI within one deposition (FIG. 17B). This means that both CGI and GGI increase simultaneously. Also, the thicker Cu(In, Ga) films are made for a GGI in the range of 0.34 to 0.39. Despite the dependence of thickness and CGI on GGI, the contour map shows a continuous decrease in Se % for an increase of GGI.

A prediction profiler analysis, as discussed later, examines the influence of the individual Cu(In, Ga) input parameters. The data used in the maps and prediction profiler are filtered for efficiencies over 5%.

Efficiency shows a clear dependence on GGI and NaF, with a maximum in the region of GGI=0.38 and NaF=12-17 nm (FIG. 17A). The sudden cliff at high GGI is attributed to too high CGI (impurity phase formation). Both the FF and $J_{sc}$ are mainly dictated by NaF, less by GGI, with the FF very sensitive to NaF and maximum close to 15 nm NaF. $V_{OC}$ is the highest in the GGI=0.38 and NaF=20 nm area, yet this does not result in the highest efficiency (15 nm).

The saturation current (not shown), ideality factor (not shown), and series resistance contour maps (FIG. 17C) strongly resemble the inverse of the FF map, with the lowest values close to 15 nm NaF and with little dependence on GGI. Typical saturation current values close to the 15 nm NaF region are around 1E-6 A/cm$^2$ (total area, not active area) with series resistance around 1.0 Ohm, and the ideality factor in the 1.50 to 1.75 range. The high ideality factors might be due to lateral non-uniformity [67].

The shunt resistance reaches its maximum in the GGI=0.36 and NaF=15 nm region, with a clear dependence on both GGI and NaF. However for co-evaporated CIGSe, no influence of Na on the shunt resistance could be observed [50]. The drop in ideality factor accompanied by an increase in shunt resistance due to optimized NaF conditions might be explained by improved lateral uniformity, e.g. less impurity phases. SEM partially supports this, but more work is needed to separate lateral variation from variations in depth.

The highest PL intensities are found for the highest open-circuit voltages, and this suggests a reduction in non-radiative recombination near the CIGS surface to be partially responsible for the improved $V_{OC}$. The bandgap $E_g$ extracted from EQE (at 20% EQE) shows a dependence on both GGI and NaF, with the highest $E_g$ for 0 nm NaF and high GGI. This suggests an increase in GGI for the top layer for high GGI and 0 nm NaF. The decrease of GGI near the CIGSe surface for 10-20 nm NaF is in agreement with the SIMS results (GGI=0.35).

To gain insight into the influence of both the GGI depth profile and CIGSe material quality on the $V_{OC}$, a contour plot of $E_g/q-V_{OC}$ is shown using $E_g$ derived from EQE. The map clearly shows improved material quality with increasing NaF thickness. Even though GGI definitely influences $V_{OC}$, the higher $V_{OC}$ is obtained for the better material quality, not the higher $E_g$ at the surface. The higher $J_{SC}$ for the higher NaF can be attributed to the combination of the lower $E_g$ in the top layer and the higher material quality.

Figure 18:
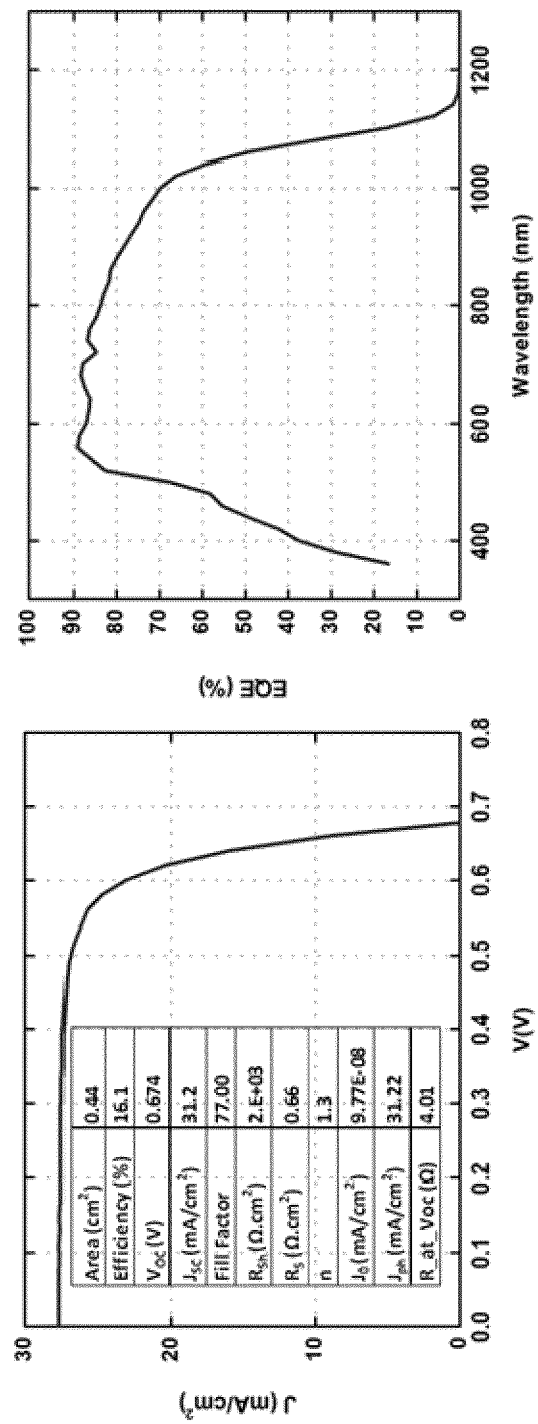
FIG. 18 presents device performance versus NaF thickness data of films formed according to some embodiments.

FIG. 18 shows the EQE spectrum and J-V curve, in addition to the J-V parameters for the champion cell (active-area efficiency=16.0%). This cell is made with 15 nm NaF, CGI=0.85, GGI=0.39, and without anti-reflection coating. The dip in EQE slightly above 700 nm is an artifact of the EQE setup.

The location of the NaF deposition within the film stack is critical. CIGSe films grown with NaF deposited on the Mo back contact resulted in peeling during CBD-CdS. The process window for NaF on top of Cu(In, Ga) was found to be much wider.

These results show that NaF addition on top of Cu(In, Ga) prior to $H_2Se$ batch selenization results in reduced gallium content and an increase in grain size for the top portion of the final CIGSe film. In addition, plan-view SEM imaging and device parameters (shunt resistance and ideality factor) suggest an improvement in lateral uniformity (less impurity phases) for optimized NaF thickness. This suggests that the CIGSe film formation for the $H_2Se$ batch selenization most likely starts with the formation of a top layer of Ga-poor CISe, followed by the in-diffusion of gallium from a Cu- and Ga-rich bottom layer [59, 69].

The CIGSe film had only a slight preferred (112) crystal orientation with no clear effect of NaF. This suggests that NaF addition provides limited control over the orientation of the starting Ga-poor CISe crystallites. Excessive air sensitivity and phase segregation of sodium selenide and sodium oxide species throughout the CIGSe film might start limiting the beneficial effects of Na [12, 17, 37, 44, 45].

It should be noted that the negative effects of Na, as proposed by Hergert et al. [51] are mainly for solid-state reactions. The typical beneficial effect of Cu—Se is attributed to liquid-assisted growth [57, 70], with the prerequisite that Cu—Se phases should not be fully consumed prior to their melting point (ranging from 377° C. to 523° C. for phases more Se-rich than $Cu_{2-x}Se$). Therefore, the beneficial effect of Na might be the result of additional control over the liquid-assisted growth. Sodium selenides more Se-rich than $Na_2Se$ are liquid starting at 258° C., and as such, might allow a wider temperature window for the beneficial liquid-assisted growth. The wider growth window may help to organize the point defects during growth, thereby providing an improved crystal structure.

Conclusions

These examples discuss a sodium fluoride (NaF) thickness variation study for the $H_2Se$ batch furnace selenization of sputtered Cu(In,Ga) films in a wide range of Cu(In, Ga) film compositions to form CIGSe films and solar cells. These results show that NaF addition on top of Cu(In, Ga) prior to $H_2Se$ batch selenization results in reduced gallium content and an increase in grain size for the top region of the final CIGSe film. In addition, plan-view SEM imaging and device parameters suggest an improvement in lateral uniformity for optimized NaF thickness.

The CIGSe film had only a slight preferred (112) crystal orientation with no clear effect of NaF. The addition of NaF resulted in improvement in all relevant device parameters: efficiency, open-circuit voltage, short-circuit current, and fill factor. Furthermore, an increase in the net hole concentration and a reduction in non-radiative recombination is observed. Further analysis showed that saturation current, ideality factor, series resistance, and shunt resistance all improve for optimized NaF conditions.

These results, combined with the various mechanisms proposed by previous authors, suggests that the negative effects of Na on $H_2Se$ batch furnace selenization of sputtered Cu(In, Ga) films, being the GGI inhomogeneity, might be mainly due to solid-state reactions, whereas the positive effects of Na, being the increase in net hole concentration and the reduction in non-radiative recombination, might be mainly dictated by liquid-assisted growth.

REFERENCES FOR THE ILLUSTRATIVE EXAMPLE

[1] Repins I, Contreras M A, Egaas B, DeHart C, Scharf J, Perkins C L, To B, Noufi R. 19.9%-efficient ZnO/CdS/CuInGaSe$_2$ solar cell with 81.2% fill factor. *Progress in Photovoltaics: Research and Applications* 2008; 16: 235.

[2] Jackson P, Hariskos D, Lotter E, Paetel S, Wuerz R, Menner R, Wischmann W, Powalla M. New world record efficiency for Cu(In,Ga)Se$_2$ thin-film solar cells beyond 20%. *Progress in Photovoltaics: Research and Applications* 2011; 19: 894.

[3] Gabor, A M, Tuttle J R, Albin D S, Contreras, M A, Noufi R, Hermann A M. High-efficiency CuIn$_x$Ga$_{1-x}$)Se$_2$ solar cells made from (In$_x$,Ga$_{1-x}$)$_2$Se$_3$ precursor films. *Applied Physics Letters* 1994; 65: 198.

[4] Wallin E, Malm U, Jarmar T, Edoff O L M, Stolt L. World-record Cu(In,Ga)Se$_2$-based thin-film sub-module with 17.4% efficiency. *Progress in Photovoltaics: Research and Applications* 2012; article in press.

[5] Nakamura M, Chiba Y, Kijima S, Horiguchi K, Yanagisawa Y, Sawai Y, Ishikawa K, Hakuma H. Achievement of 17.5% efficiency with 30×30 cm$^2$-sized Cu(In,Ga)(Se,S)$_2$ submodules. *38$^{th}$ IEEE Photovoltaic Specialists Conference* 2012; accepted.

[6] Hollars D R, Dorn R, Paulson P D, Titus J, Zubeck R. Large area Cu(In,Ga)Se$_2$ films and devices on flexible substrates made by sputtering. *Materials Research Society Symposium Proceedings* 2005; 865: 477.

[7] Chen C H, Shih W C, Chien C Y, Hsu C H, Wu Y H, Lay C H. A promising sputtering route for one-step fabrication of chalcopyrite phase Cu(In,Ga)Se$_2$ absorbers without extra Se supply. *Solar Energy Materials and Solar Cells* 2012; 103: 25.

[8] Hibberd C J, Chassaing E, Liu W, Mitzi D B, Lincot D, Tiwari A N. Non-vacuum methods for formation of Cu(In, Ga)(Se,S)$_2$ thin film photovoltaic absorbers. *Progress in Photovoltaics: Research and Applications* 2010; 18: 434.

[9] Hedstrom J, Ohlsen H, Bodegard M, Klyner A, Stolt L, Hariskos D, Ruckh M, Schock H W. ZnO/CdS/Cu(In,Ga)Se$_2$ thin film solar cells with improved performance. 23$^{rd}$ *IEEE Photovoltaic Specialists Conference* 1993; 364.

[10] Dawson-Elli D F, Moore C B, Gay R R, Jensen C L. Substrate influences on CIS device performance. 24$^{th}$ *IEEE Photovoltaic Specialists Conference* 1994; 152.

[11] Scheer R, Schock H W. *Chalcogenide Photovoltaics*, Wiley-VCH: Weinheim, 2011: 262-264.

[12] Song X, Caballero R, Felix R, Gerlach D, Kaufmann C A, Schock H W, Wilks R G, Bär, M. Na incorporation into Cu(In,Ga)Se$_2$ thin-film solar cell absorbers deposited on polyimide: Impact on the chemical and electronic surface structure. *Journal of Applied Physics* 2012; 111: 034903.

[13] Wei S H, Zhang S B, Zunger A. Effects of Na on the electrical and structural properties of CuInSe$_2$. *Journal of Applied Physics* 1999; 85: 7214.

[14] Kronik L, Cahen D, Schock H W. Effects of sodium on polycrystalline Cu(In,Ga)Se$_2$ and its solar cell performance. *Advanced Materials* 1998; 10: 31.

[15] Rockett A. The effect of Na in polycrystalline and epitaxial single-crystal CuIn$_{1-x}$Ga$_x$Se$_2$. *Thin Solid Films* 2005; 480-481: 2.

[16] Jackson P, Wurz R, Rau U, Mattheis J, Kurth M, Schlötzer T, Bilger G, Werner J H. High quality baseline for high efficiency, Cu(In$_{1-x}$,Ga$_x$)Se$_2$ solar cells. *Progress in Photovoltaics: Research and Applications* 2007; 15: 507.

[17] Granath K, Bodegard M, Stolt L. The effect of NaF on Cu(In,Ga)Se$_2$ thin film solar cells. *Solar Energy Materials and Solar Cells* 2000; 60: 279.

[18] Chirila A, Buecheler S, Pianezzi F, Bloesch P, Gretener C, Uhl A R, Fella C, Kranz L, Perrenoud J, Seyrling S, Verma R, Nishiwaki S, Romanyuk Y E, Bilger G, Tiwari A N. Highly efficient Cu(In,Ga)Se$_2$ solar cells grown on flexible polymer films. *Nature Materials* 2011; 10: 857.

[19] Rudmann D, Bilger G, Kaelin M, Haug F J, Zogg H, Tiwari A N. Effects of NaF coevaporation on structural properties of Cu(In,Ga)Se$_2$ thin films. *Thin Solid Films* 2003; 431-432: 37.

[20] Eisenbarth T, Caballero R, Kaufmann C A, Eicke A, Unold T. Influence of iron on defect concentrations and device performance for Cu(In,Ga)Se$_2$ solar cells on stainless steel substrates. *Progress in Photovoltaics: Research and Applications* 2012; 20: 568.

[21] Ishizuka S, Yamada A, Islam M M, Shibata H, Fons P, Sakurai T, Akimoto K, Niki S. Na-induced variations in the structural, optical, and electrical properties of Cu(In,Ga)Se$_2$ thin films. *Journal of Applied Physics* 2009; 106: 034908.

[22] Izquierdo-Roca V, Caballero R, Fontane X, Kaufmann C A, Alvarez-Garcia J, Calvo-Barrio L, Saucedo E, Perez-Rodriguez A, Morante J R, Schock H W. Raman scattering analysis of Cu-poor Cu(In,Ga)Se$_2$ cells fabricated on polyimide substrates: Effect of Na content on microstructure and phase structure. *Thin Solid Films* 2011; 519: 7300.

[23] Lundberg O, Lu J, Rockett A, Edoff M, Stolt L. Diffusion of indium and gallium in Cu(In,Ga)Se$_2$ thin film solar cells. *Journal of Physics and Chemistry of Solids* 2003; 64: 1499.

[24] Rudmann D, Bremaud D, Zogg H, Tiwari A N. Na incorporation into Cu(In,Ga)Se$_2$ for high-efficiency flexible solar cells on polymer foils. *Journal of Applied Physics* 2005; 97: 084903.

[25] Contreras M A, Mansfield L M, Egaas B, Li J, Romero M, Noufi R, Rudiger-Voigt E, Mannstadt W. Improved energy conversion efficiency in wide bandgap Cu(In,Ga)Se$_2$ solar cells. 37$^{th}$ *IEEE Photovoltaic Specialists Conference* 2011; 26.

[26] Seyrling S, Chirila A, Güttler D, Blösch P, Pianezzi F, Verma R, Bücheler S, Nishiwaki S, Romanyuk Y E, Rossbach P, Tiwari A N. CuIn$_{1-x}$Ga$_x$Se$_2$ growth process modifications: Influences on microstructure, Na distribution, and device properties. *Solar Energy Materials and Solar Cells* 2011; 95: 1477.

[27] Schleussner S M, Törndahl T, Linnarsson M, Zimmermann U, Wätjen T, Edoff M. Development of gallium gradients in three-stage Cu(In,Ga)Se$_2$ co-evaporation processes. *Progress in Photovoltaics: Research and Applications* 2012; 20: 284.

[28] Kessler J, Chityuttakan C, Lu J, Schöldström J, Stolt L. Cu(In,Ga)Se$_2$ thin films grown with a Cu-poor/rich/poor sequence: growth model and structural considerations. *Progress in Photovoltaics: Research and Applications* 2003; 11: 319.

[29] Abou-Ras D, Contreras M A, Noufi R, Schock H W. Impact of the Se evaporation rate on the microstructure and texture of Cu(In,Ga)Se$_2$ thin films for solar cells. *Thin Solid Films* 2009; 517: 2218.

[30] Lammer M, Kniese R, Powalla M. In-line deposited Cu(In,Ga)Se$_2$ solar cells: influence of deposition temperature and Na co-evaporation on carrier collection. *Thin Solid Films* 2004; 451-452: 175.

[31] Rudmann D, da Cunha A F, Kaelin M, Kurdesau F, Zogg H, Tiwari A N, Bilger G. Efficiency enhancement of Cu(In,Ga)Se$_2$ solar cells due to post-deposition Na incorporation. *Applied Physics Letters* 2004; 84: 1129.

[32] Gabor A M, Tuttle J R, Bode M H, Franz A, Tennant A L, Contreras M A, Noufi R, Jensen D G, Hermann A M. Band-gap engineering in Cu(In,Ga)Se$_2$ thin films grown from (In,Ga)$_2$Se$_3$ precursors. *Solar Energy Materials and Solar Cells* 1996; 41-42: 247.

[33] Albin D S, Mooney G D, Duda A, Tuttle J, Matson R, Noufi R. Enhanced grain growth in polycrystalline CuInSe$_2$ using rapid thermal processing. *Solar Cells* 1991, 30: 47.

[34] Shafarman W N, Zhu J. Effect of substrate temperature and deposition profile on the evaporated Cu(In,Ga)Se$_2$ films and devices. *Thin Solid Films* 2000; 361-362: 473.

[35] Zellner M B, Birkmire R W, Eser E, Shafarman W N, Chen J G. Determination of activation barriers for the diffusion of sodium through CIGS thin-film solar cells. *Progress in Photovoltaics: Research and Applications* 2003; 11: 543.

[36] Ishizuka S, Shibata H, Yamada A, Fons P, Sakurai K, Matsubara K, Niki S, Yonemura M, Nakanishi H. Control of the thin film properties of Cu(In,Ga)Se$_2$ using water vapor introduction during growth. *Journal of Applied Physics* 2006; 100: 096106.

[37] Heske C, Fink R, Umbach E, Riedl W, Karg F. Na-induced effects on the electronic structure and composition of Cu(In,Ga)Se$_2$ thin-film surfaces. *Applied Physics Letters* 1996; 68: 3431.

[38] Heske C, Eich D, Fink R, Umbach E, Van Buuren T, Bostedt C, Kakar S, Terminello L J, Grush M M, Callcott T A, Himpsel F J, Ederer D L, Perera R C C, Riedl W, Karg F. Semi-quantitative and non-destructive analysis of impurities at a buried interface: Na and the CdS/Cu(In,Ga)Se$_2$ heterojunction. *Surface and Interface Analysis* 2000; 30: 459.

[39] Cojocaru-Miredin O, Choi P, Wuerz R, Raabe D. Atomic-scale distribution of impurities in CuInSe$_2$-based thin-film solar cells. *Ultramicroscopy* 2011; 111: 552.

[40] Couzinie-Devy F, Cadel E, Barreau N, Pareige P, Kessler J. Atom probe contribution to the characterization of CIGSe grain boundaries. 37$^{th}$ *IEEE Photovoltaic Specialists Conference* 2011; 571.

[41] Niles D W, Al-Jassim M, Ramanathan K. Direct observation of Na and O impurities at grain surfaces of CuInSe$_2$ thin films. *Journal of Vacuum Science and Technology A* 1999; 17: 291.

[42] Schröder D J, Rockett A A. Electronic effects of sodium in epitaxial $CuIn_{1-x}Ga_xSe_2$. *Journal of Applied Physics* 1997; 82: 4982.

[43] Grabitz P O, Rau U, Wille B, Bilger G, Werner J H. Spatial inhomogeneities in $Cu(In,Ga)Se_2$ solar cells analyzed by an electron beam induced voltage technique. *Journal of Applied Physics* 2006; 100: 124501.

[44] Heske C, Groh U, Fuchs O, Weinhardt L, Umbach E, Schedel-Niedrig Th, Fischer Ch-H, Lux-Steiner M Ch, Zweigart S, Niesen T P, Karg F, Denlinger J D, Rude B, Andrus C, Powell F. Monitoring chemical reactions at a liquid-solid interface: Water on $CuIn(S,Se)_2$ thin film solar cell absorbers. *Journal of Chemical Physics* 2003; 119: 10467.

[45] Nadenau V, Lippold G, Rau U, Schock H W. Sodium induced secondary phase segregations in $CuGaSe_2$ thin films. *Journal of Crystal Growth* 2001; 233: 13.

[46] Caballero R, Kaufmann C A, Eisenbarth T, Grimm A, Lauermann I, Unold T, Klenk R, Schock H W. Influence of Na on $Cu(In,Ga)Se_2$ solar cells grown on polyimide substrates at low temperature: Impact on the $Cu(In,Ga)Se_2$/Mo interface. *Applied Physics Letters* 2010; 96: 092104.

[47] Braunger D, Hariskos D, Bilger G, Rau U, Schock H W. Influence of sodium on the growth of polycrystalline $Cu(In,Ga)Se_2$ thin films. *Thin Solid Films* 2000; 361-362: 161.

[48] Wada T, Kohara N, Negami T, Nishitani M. Chemical and structural characterization of $Cu(In,Ga)Se_2$/Mo interface in $Cu(In,Ga)Se_2$ solar cells. *Japanese Journal of Applied Physics* 1996; 35: L1253.

[49] Abou-Ras D, Mukherji D, Kostorz G, Bremaud D, Kälin M, Rudmann D, Döbeli M, Tiwari A N. Dependence of the $MoSe_2$ formation on the Mo orientation and the Na concentration for $Cu(In,Ga)Se_2$ thin-film solar cells. *Material Research Society Symposium Proceedings* 2005; 865: F8.1.1.

[50] Virtuani A, Lotter E, Powalla M, Rau U, Werner J H, Acciarri M. Influence of Cu content on electronic transport and shunting behavior of $Cu(In,Ga)Se_2$ solar cells. *Journal of Applied Physics* 2006; 99: 014906.

[51] Hergert F, Jost S, Hock R, Purwins M, Palm J. Formation reactions of chalcopyrite compounds and the role of sodium doping. *Thin Solid Films* 2007; 515: 5843.

[52] Contreras M A, Egaas B, Dippo P, Webb J, Granata J, Ramanathan K, Asher S, Swartzlander A, Noufi R. On the role of Na and modifications to $Cu(In,Ga)Se_2$ absorber materials using thin-MF (M=Na, K, Cs) precursor layers. $26^{th}$ *IEEE Photovoltaic Specialists Conference* 1997; 359.

[53] Kronik L, Rau U, Guillemoles J F, Braunger D, Schock H W, Cahen D. Interface redox engineering of $Cu(In,Ga)Se_2$-based solar cells: oxygen, sodium, and chemical bath effects. *Thin Solid Films* 2000; 361-362: 353.

[54] Mungan E S, Wang X, Alam M A. Modeling the effects of Na incorporation on CIGS solar cells. $38^{th}$ *IEEE Photovoltaic Specialists Conference* 2012; accepted.

[55] Wieting, R, Gay R, Nguyen H, Palm J, Rischmiller C, Seapan A, Tarrant D, Willett D. CIS thin film manufacturing at Shell Solar: Practical techniques in volume manufacturing. $31^{st}$ *IEEE Photovoltaic Specialists Conference* 2005; 177.

[56] Probst V, Rimmasch J, Riedl W, Stetter W, Holz J, Harms H, Karg F, Schock H W. Impact of controlled sodium incorporation on rapid thermal processed $Cu(InGa)Se_2$-thin films and devices. $24^{th}$ *IEEE Photovoltaic Specialists Conference* 1994; 1: 144.

[57] Probst V, Karg F, Rimmasch J, Riedl W, Stetter W, Harms H, Eibl O. Advanced stacked elemental layer process for $Cu(InGa)Se_2$ thin film photovoltaic devices. *Materials Research Society Symposium Proceedings* 1996; 426: 165.

[58] Rau U, Schmitt M, Hilburger D, Engelhardt F, Seifert O, Parisi J, Riedl W, Rimmasch J, Karg F. Influence of Na and S incorporation on the electronic transport properties of $Cu(In,Ga)Se_2$ solar cells. $25^{th}$ *IEEE Photovoltaic Specialists Conference* 1996; 1005.

[59] Hergert F, Hock R, Weber A, Purwins M, Palm J, Probst V. In situ investigation of the formation of $Cu(In,Ga)Se_2$ from selenised metallic precursors by X-ray diffraction—The impact of gallium, sodium and selenium excess. *Journal of Physics and Chemistry of Solids* 2005; 66: 1903.

[60] Hergert F, Jost S, Hock R, Purwins M, Palm J. A thermodynamical approach to the formation reactions of sodium-doped $Cu(In,Ga)Se_2$. *Thin Solid Films* 2006; 511-512: 147.

[61] Heske C, Eich D, Groh U, Fink R, Umbach E, Van Buuren T, Bostedt C, Franco N, Terminello L J, Grush M M, Callcott T A, Himpsel F J, Ederer D L, Perera R C C, Riedl W, Karg F. Self-limitation of Na content at the $CdS/Cu(In,Ga)Se_2$ solar cell heterojunction. *Thin Solid Films* 2000; 361-362: 360.

[62] Phang J, Chan D, Phillips J. Accurate analytical method for the extraction of solar cell model parameters. *Electronics Letters* 1984; 20: 406.

[63] Goushi Y, Hakuma H, Tabuchi K, Kijima S, Kushiya K. Fabrication of pentanary $Cu(InGa)(SeS)_2$ absorbers by selenization and sulfurization. *Solar Energy Materials & Solar Cells* 2009; 93: 1318.

[64] Probst V, Hergert F, Walther B, Thyen R, Batereau-Neumann G, Neumann B, Windeck A, Letzig T, Gerlach A. High performance CIS solar modules: status of production and development at Johanna Solar Technology. $24^{th}$ *European Photovoltaic Solar Energy Conference* 2009; 2455.

[65] Kim K, Hanket G M, Huynh T, Shafarman W N. Three-step $H_2Se/Ar/H_2S$ reaction of Cu—In—Ga precursors for controlled composition and adhesion of $Cu(In,Ga)(Se,S)_2$ thin films. *Journal of Applied Physics* 2012; 111: 083710.

[66] Van Duren J K J, Leidholm C, Pudov A, Robinson M R, Roussillon Y. The next generation of thin-film photovoltaics. *Materials Research Society Symposium Proceedings* 2007; 1012: 1012-Y05-03.

[67] Grabitz P O, Rau U, Werner J H. A multi-diode model for spatially inhomogeneous solar cells. *Thin Solid Films* 2005; 487: 14.

[68] Liang H, Liu W, Sang L, Van Duren, J, Franklin T, Patten M, Nijhawan S. High efficiency CIGSe solar cells by combinatorially sputtered Cu(In,Ga) followed by selenization. $38^{th}$ *IEEE Photovoltaic Specialists Conference* 2012; accepted.

[69] Hanket G M, Kamada R, Kim W K, Shafarman W N. Effect of reaction temperature on $Cu(InGa)(SeS)_2$ formation by a sequential $H_2Se/H_2S$ precursor reaction process. $34^{th}$ *IEEE Photovoltaic Specialists Conference* 2008.

[70] Klenk R, Walter T, Schock H W, Cahen D. A model for the successful growth of polycrystalline films of $CuInSe_2$ by multisource physical vacuum evaporation. *Advanced Materials* 1993; 5: 114.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a chalcogenide on a substrate, the method comprising:

forming a metal film on the substrate;

forming a layer comprising one of Na, K, or Ca directly on the metal film;

heating the substrate with the metal film and the layer to a first temperature while maintaining a pressure in a processing chamber at a first level of between about 760 Torr and 1520 Torr, while maintaining the substrate with the metal film and the layer at the first temperature, reducing the pressure in the processing chamber to a second level to between about 600 Torr and 700 Torr; and while maintaining the substrate with the metal film and the layer at the first temperature in the processing chamber having the pressure at the second level, flowing a chalcogen precursor into the processing chamber.

2. The method of claim 1, wherein the layer comprises NaF and is formed using Chemical Vapor Deposition (CVD).

3. The method of claim 2, wherein forming the layer comprising flowing a CVD precursor into the processing chamber, the CVD precursor comprising one of sodium hexafluoro-iso-propoxide, sodium perfluoro-t-butoxide, sodium hexafluoroacetylacetonate, or sodium heptafluoro-octadionate.

4. The method of claim 1, wherein a thickness of the layer is between 5 nm and 100 nm.

5. The method of claim 1, further comprising chalcogenating the metal film and the layer followed by annealing.

6. The method of claim 1, wherein the metal film comprises Cu, In, and Ga.

7. The method of claim 6, wherein the metal film further comprises Ag.

8. The method of claim 1, wherein the first temperature is between 350 C and about 450 C.

9. The method of claim 1, wherein the first temperature is between 400 C and about 450 C.

10. The method of claim 1, wherein a concentration of the chalcogen precursor is about 1 molar % when the chalcogen precursor is flown into the processing chamber.

11. The method of claim 1, further comprising, after flowing the chalcogen precursor into the processing chamber, flowing an inert gas into the processing chamber, and heating the substrate to a second temperature of between about 450 C and about 550 C.

12. The method of claim 11, wherein the substrate is heated to the second temperature while maintaining a pressure in a processing chamber at the first level of between about 760 Torr and 1520 Torr.

13. The method of claim 12, further comprising, while maintaining the substrate at the second temperature, reducing the pressure in the processing chamber to the second level to between about 600 Torr and 700 Torr; and wherein while maintaining the substrate at the second temperature in the processing chamber having the pressure at the second level, flowing an additional chalcogen precursor into the processing chamber.

14. The method of claim 13, wherein the additional chalcogen precursor and the chalcogen precursor are same.

15. The method of claim 13, further comprising, after flowing the additional chalcogen precursor into the processing chamber, flowing an inert gas into the processing chamber, and heating the substrate to a third temperature of between about 550 C and about 650 C.

16. The method of claim 15, wherein the substrate is heated to the third temperature while maintaining a pressure in a processing chamber at the first level of between about 760 Torr and 1520 Torr.

17. The method of claim 16, further comprising, while maintaining the substrate at the third temperature, reducing the pressure in the processing chamber to about 600 Torr; and wherein while maintaining the substrate at the third temperature in the processing chamber having the pressure of about 600 Torr, flowing a sulfur containing precursor into the processing chamber.

18. The method of claim 1, wherein the metal film is partially chalcogenized prior to forming the layer comprising one of Na, K, or Ca.

19. The method of claim 1, wherein the layer formed directly on the metal film comprises potassium (K).

20. The method of claim 1, wherein the layer formed directly on the metal film comprises calcium (Ca).

* * * * *